United States Patent
Hwang et al.

(10) Patent No.: US 10,818,678 B2
(45) Date of Patent: Oct. 27, 2020

(54) THREE-DIMENSIONAL SEMICONDUCTOR MEMORY DEVICE AND METHOD OF FABRICATING THE SAME

(71) Applicant: SAMSUNG ELECTRONICS CO., LTD., Suwon-si, Gyeonggi-Do (KR)

(72) Inventors: Sung-Min Hwang, Hwasung-si (KR); Dong-Sik Lee, Hwasung-si (KR); Joon-Sung Lim, Hwasung-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 109 days.

(21) Appl. No.: 15/954,151

(22) Filed: Apr. 16, 2018

(65) Prior Publication Data

US 2019/0035798 A1   Jan. 31, 2019

(30) Foreign Application Priority Data

Jul. 31, 2017   (KR) ........................ 10-2017-0097249

(51) Int. Cl.

| | |
|---|---|
| H01L 27/112 | (2006.01) |
| H01L 27/11556 | (2017.01) |
| H01L 27/11582 | (2017.01) |
| H01L 23/532 | (2006.01) |
| H01L 27/11573 | (2017.01) |
| H01L 29/06 | (2006.01) |
| H01L 27/11526 | (2017.01) |
| H01L 27/11575 | (2017.01) |

(52) U.S. Cl.
CPC .. *H01L 27/11286* (2013.01); *H01L 23/53295* (2013.01); *H01L 27/11526* (2013.01); *H01L 27/11556* (2013.01); *H01L 27/11573* (2013.01); *H01L 27/11575* (2013.01); *H01L 27/11582* (2013.01); *H01L 29/0649* (2013.01)

(58) Field of Classification Search
CPC ................................. H01L 27/11286
See application file for complete search history.

(56) References Cited

U.S. PATENT DOCUMENTS

| | | | |
|---|---|---|---|
| 8,048,798 B2 * | 11/2011 | Kidoh | H01L 21/8221 216/39 |
| 8,735,967 B2 * | 5/2014 | Lim | H01L 27/11565 257/326 |

(Continued)

*Primary Examiner* — Lex H Malsawma
(74) *Attorney, Agent, or Firm* — F. Chau & Associates, LLC

(57) ABSTRACT

A three-dimensional semiconductor memory device includes a substrate including a peripheral circuit region and a cell array region, a plurality of peripheral gate stacks disposed in the peripheral circuit region, and an electrode structure disposed in the cell array region. The electrode structure includes a lower electrode, a lower insulating layer disposed on the lower electrode, and upper electrodes and upper insulating layers alternately stacked on the lower insulating layer. The lower insulating layer extends from the cell array region into the peripheral circuit region and covers the peripheral gate stacks. The lower insulating layer includes a first lower insulating layer and a second lower insulating layer sequentially stacked on one another. The first lower insulating layer includes a first insulating material, and the second lower insulating layer includes a second insulating material different from the first insulating material.

19 Claims, 28 Drawing Sheets

(56) References Cited

U.S. PATENT DOCUMENTS

| | | | |
|---|---|---|---|
| 9,202,570 B2 | 12/2015 | Hwang et al. | |
| 9,299,716 B2 | 3/2016 | Hwang et al. | |
| 9,425,208 B2* | 8/2016 | Kim | H01L 27/11582 |
| 9,431,418 B2 | 8/2016 | Jung et al. | |
| 10,177,160 B2* | 1/2019 | Pyon | H01L 27/11286 |
| 2012/0211823 A1* | 8/2012 | Lim | H01L 27/11565 |
| | | | 257/326 |
| 2014/0246724 A1* | 9/2014 | Jang | G11C 5/025 |
| | | | 257/368 |
| 2016/0293625 A1* | 10/2016 | Kang | H01L 27/11582 |
| 2016/0343725 A1* | 11/2016 | Jung | H01L 27/11573 |
| 2017/0077113 A1* | 3/2017 | Nomachi | H01L 27/11556 |
| 2018/0166454 A1* | 6/2018 | Pyon | H01L 27/11286 |
| 2018/0277561 A1* | 9/2018 | Yamamoto | H01L 27/11582 |

* cited by examiner

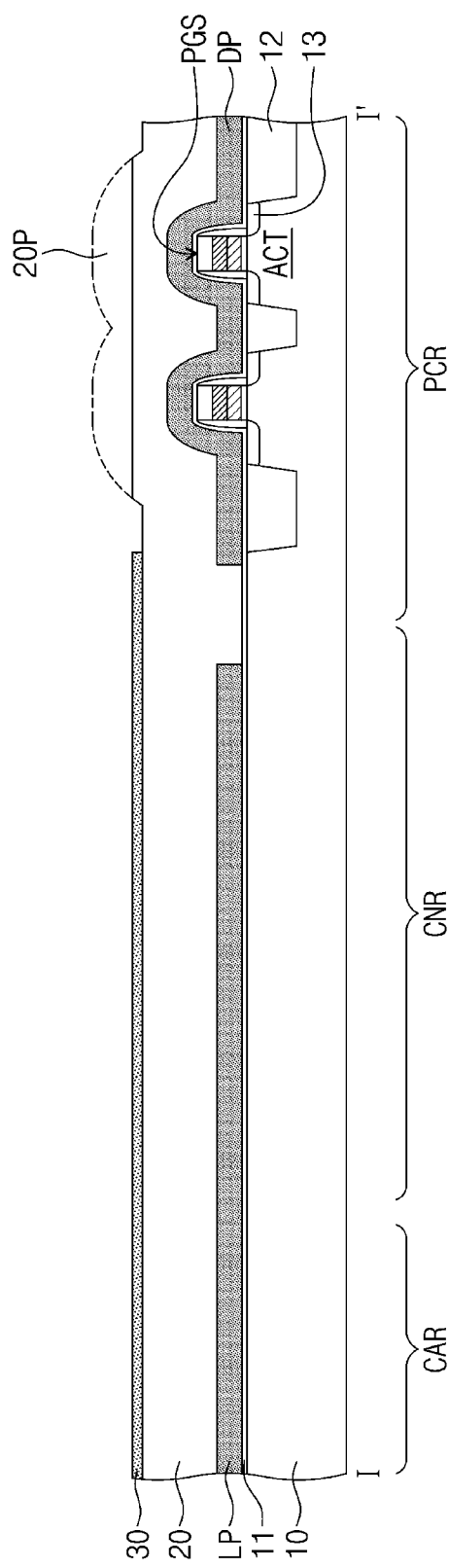
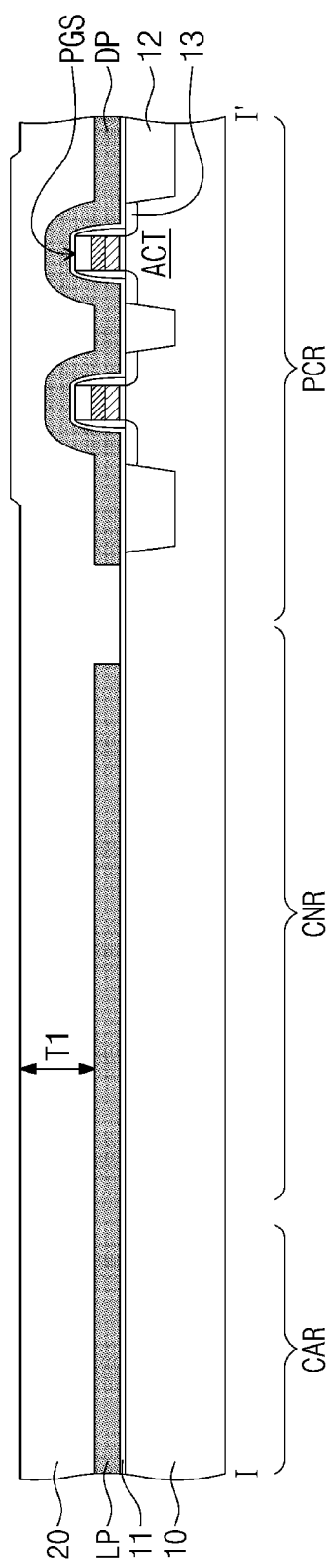

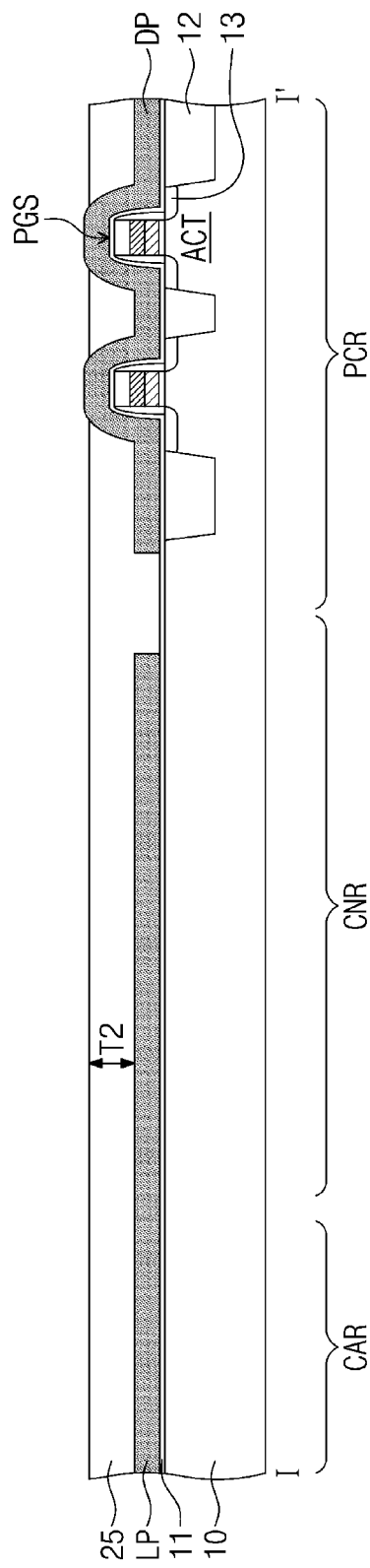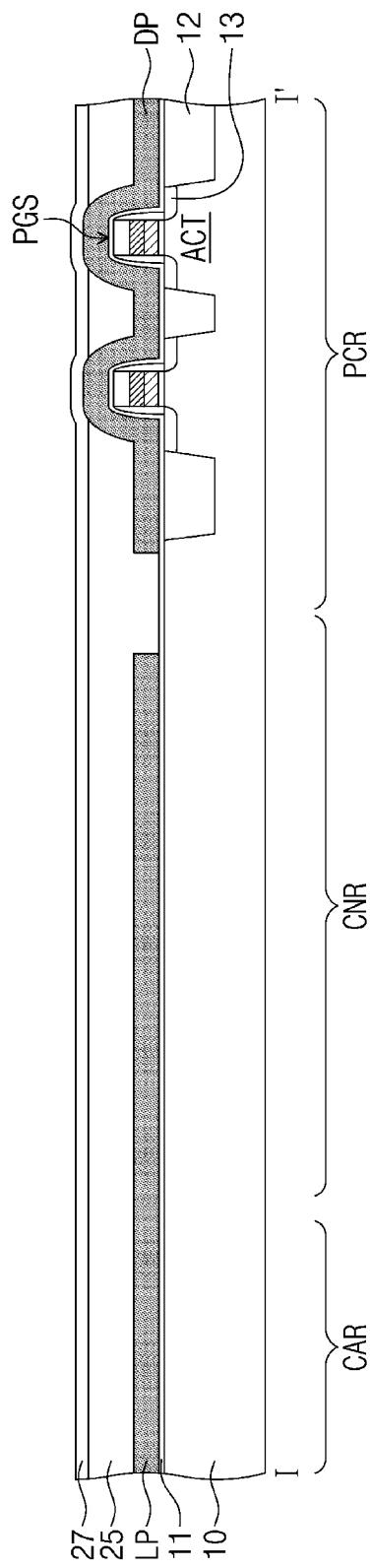

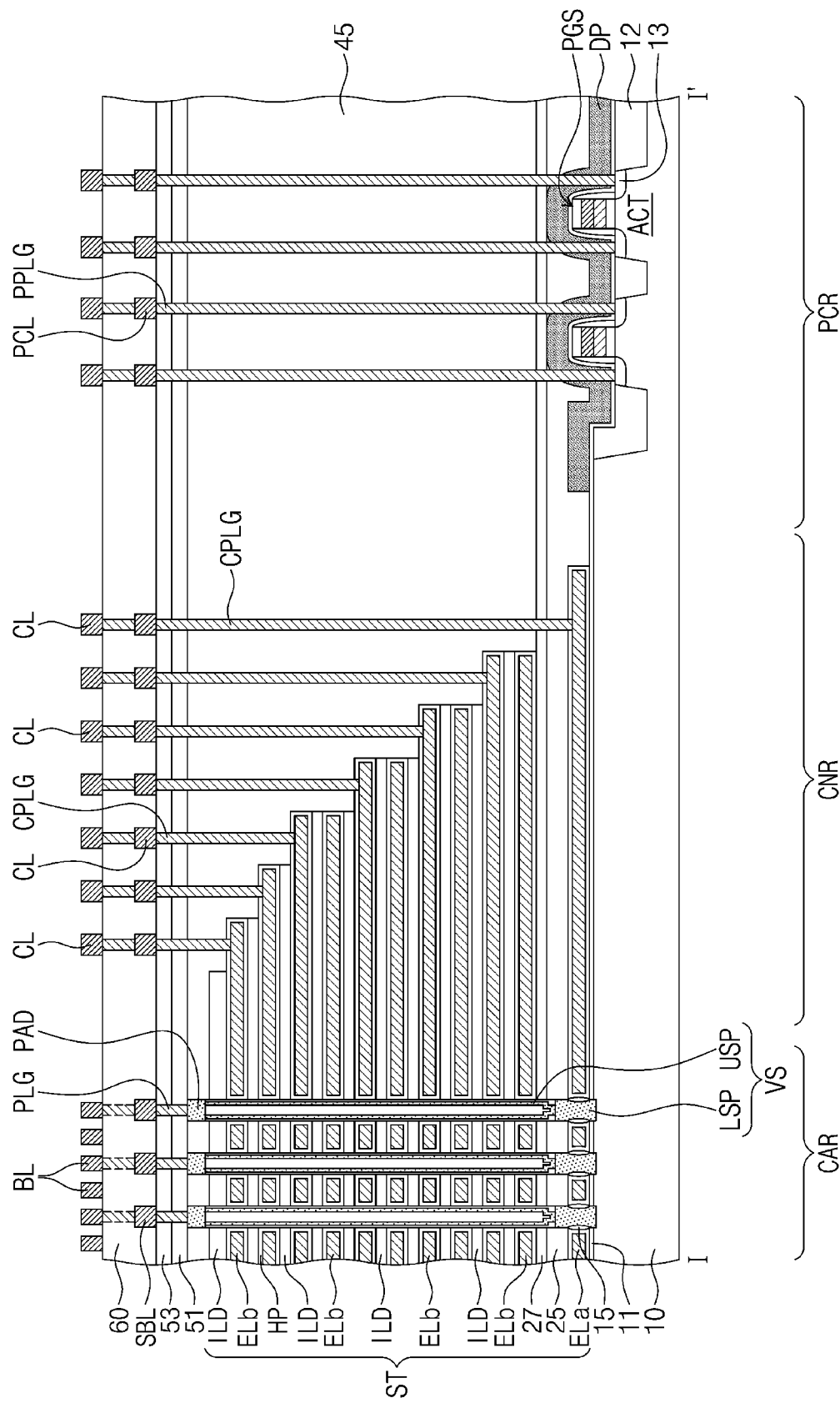

THREE-DIMENSIONAL SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2017-0097249, filed on Jul. 31, 2017, in the Korean Intellectual Property Office, the disclosure of which is incorporated by reference herein in its entirety.

TECHNICAL FIELD

Exemplary embodiments of the present inventive concept relate to a three-dimensional semiconductor memory device, and more particularly, to a three-dimensional semiconductor memory device with increased integration density and improved reliability, and a method of fabricating the same.

DISCUSSION OF THE RELATED ART

Increasing integration of semiconductor devices may decrease manufacturing costs of semiconductor devices and increase the performance of semiconductor devices. Since the integration of two-dimensional or planar semiconductor devices is substantially determined by the area occupied by a unit memory cell, integration is greatly influenced by the level of fine pattern forming technology. However, the expensive process equipment used to increase pattern fineness sets a practical limitation on increasing integration for two-dimensional or planar semiconductor devices. To overcome such a limitation, three-dimensional semiconductor memory devices including three-dimensionally arranged memory cells may be utilized.

SUMMARY

Exemplary embodiments of the inventive concept provide a three-dimensional semiconductor memory device having high reliability and a high integration density.

Exemplary embodiments of the inventive concept provide a method of fabricating a three-dimensional semiconductor memory device with improved productivity.

According to an exemplary embodiment of the inventive concept, a three-dimensional semiconductor memory device includes a substrate including a peripheral circuit region and a cell array region, a plurality of peripheral gate stacks disposed in the peripheral circuit region of the substrate, and an electrode structure disposed in the cell array region of the substrate. The electrode structure includes a lower electrode, a lower insulating layer disposed on the lower electrode, and a plurality of upper electrodes and a plurality of upper insulating layers alternately stacked on the lower insulating layer. The lower insulating layer extends from the cell array region into the peripheral circuit region and covers the peripheral gate stacks. The lower insulating layer includes a first lower insulating layer and a second lower insulating layer, and the first and second lower insulating layers are sequentially stacked. The first lower insulating layer includes a first insulating material, and the second lower insulating layer includes a second insulating material different from the first insulating material.

According to an exemplary embodiment of the inventive concept, a three-dimensional semiconductor memory device includes a substrate including a peripheral circuit region and a cell array region, a plurality of peripheral gate stacks disposed in the peripheral circuit region of the substrate, and an electrode structure disposed in the cell array region of the substrate. The electrode structure includes a lower electrode, a lower insulating layer disposed on the lower electrode, and a plurality of upper electrodes and a plurality of upper insulating layers alternately stacked on the lower insulating layer. The lower insulating layer extends from the cell array region into the peripheral circuit region and covers the peripheral gate stacks. A top surface of the lower insulating layer is lower in the cell array region than in the peripheral circuit region.

According to an exemplary embodiment of the inventive concept, a three-dimensional semiconductor memory device includes a substrate including a peripheral circuit region and a cell array region, a plurality of peripheral gate stacks disposed in the peripheral circuit region of the substrate, and an electrode structure disposed in the cell array region of the substrate. The electrode structure includes a lower electrode, a lower insulating layer disposed on the lower electrode, and a plurality of upper electrodes and a plurality of upper insulating layers alternately stacked on the lower insulating layer. The lower insulating layer extends from the cell array region into the peripheral circuit region and covers the peripheral gate stacks. The lower insulating layer includes a first lower insulating layer and a second lower insulating layer sequentially stacked on each other. The second lower insulating layer includes a first portion in the cell array region and a second portion in the peripheral circuit region, and the second portion is thinner than the first portion.

According to an exemplary embodiment of the inventive concept, a method of fabricating a three-dimensional semiconductor memory device includes forming a plurality of peripheral gate stacks in a peripheral circuit region of a substrate, and sequentially forming a lower sacrificial layer and a lower insulating layer in a cell array region of the substrate. The lower sacrificial layer and the lower insulating layer conformally cover the cell array region and the peripheral gate stacks, and the lower insulating layer includes a protrusion portion disposed on the peripheral gate stacks. The method further includes forming a first lower insulating layer by performing a planarization process on the lower insulating layer, and forming a mold structure by alternately stacking a plurality of upper sacrificial layers and a plurality of upper insulating layers on the first lower insulating layer in the cell array region. Performing the planarization process on the lower insulating layer includes measuring a first thickness of the lower insulating layer in the cell region by performing a first measurement process, determining at least one process parameter relating to an etching process based on the first thickness, and performing the etching process on the lower insulating layer using the determined at least one process parameter.

According to an exemplary embodiment of the inventive concept, a method of fabricating a three-dimensional semiconductor memory device includes forming a plurality of peripheral gate stacks in a peripheral circuit region of a substrate, and forming an electrode structure in a cell array region of the substrate. The electrode structure includes a lower electrode, a lower insulating layer disposed on the lower electrode, and a plurality of upper electrodes and a plurality of upper insulating layers alternately stacked on the lower insulating layer. The lower insulating layer extends from the cell array region into the peripheral circuit region and covers the peripheral gate stacks. The lower insulating layer includes a first lower insulating layer and a second lower insulating layer, and the first and second lower insulating layers are sequentially stacked. The first lower insulating layer includes a first insulating material, and the second lower insulating layer includes a second insulating material different from the first insulating material.

BRIEF DESCRIPTION OF THE DRAWINGS

The above and other features of the present inventive concept will become more apparent by describing in detail exemplary embodiments thereof with reference to the accompanying drawings, in which:

FIGS. 11A to 11J are cross-sectional views taken along line I-I' of FIG. 3, and illustrate a method of fabricating a three-dimensional semiconductor memory device according to exemplary embodiments of the inventive concept.

FIGS. 12A to 12D, 13A to 13C, and 14A to 14G are cross-sectional views taken along line I-I' of FIG. 3, and illustrate methods of fabricating a three-dimensional semiconductor memory device according to exemplary embodiments of the inventive concept.

DETAILED DESCRIPTION OF THE EXEMPLARY EMBODIMENTS

Figure 1:
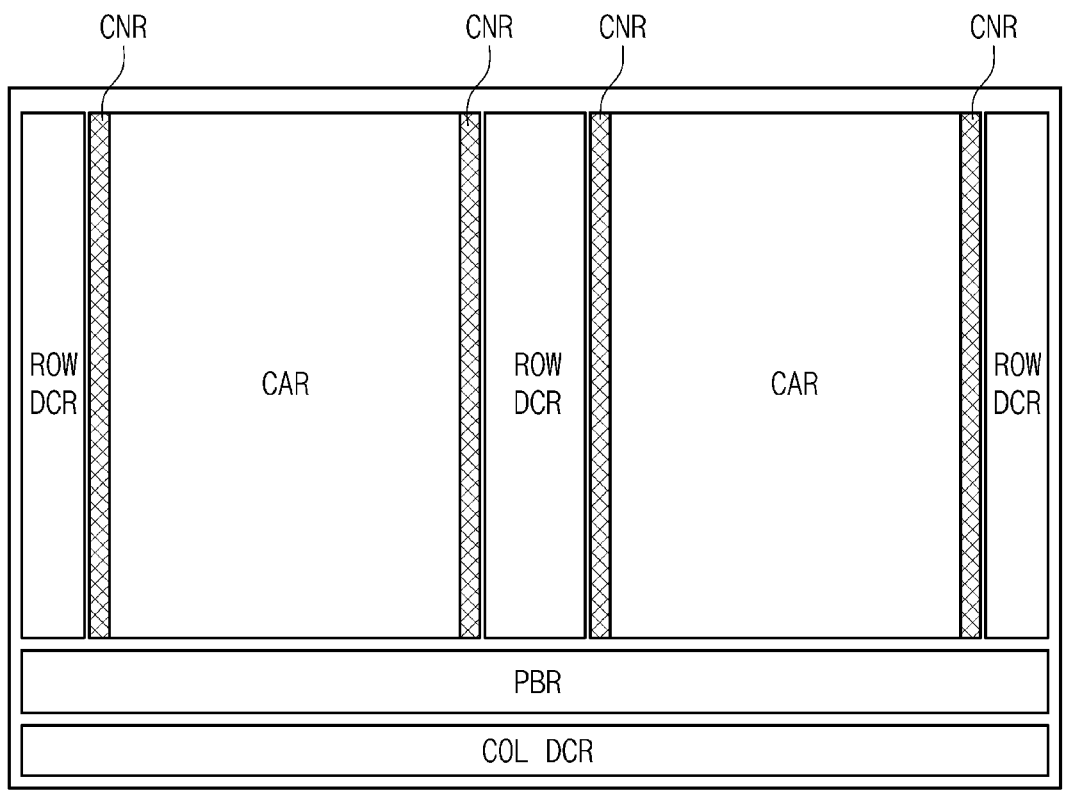
FIG. 1 is a plan view illustrating a schematic configuration of a three-dimensional semiconductor memory device according to exemplary embodiments of the inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements are described as being located at substantially the same height, it is to be understood that the two or more elements are located at exactly the same height, or at approximately the same height within a measurement error as would be understood by a person having ordinary skill in the art. Similarly, when two or more elements are described as being substantially aligned with one another, it is to be understood that the two or more elements are exactly aligned with one another, or are approximately aligned with one another within a measurement error as would be understood by a person having ordinary skill in the art. Similarly, when two or more elements are described as having substantially the same thicknesses, it is to be understood that the two or more elements have exactly the same thickness, or approximately the same thickness within a measurement error as would be understood by a person having ordinary skill in the art. Other uses of the term substantially herein are to be similarly understood.

FIG. 1 is a plan view illustrating a schematic configuration of a three-dimensional semiconductor memory device according to exemplary embodiments of the inventive concept.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region. In exemplary embodiments, a connection region CNR may be provided between the cell array region CAR and each of the row decoder regions ROW DCR.

A memory cell array including a plurality of memory cells may be provided in the cell array region CAR. In exemplary embodiments, the memory cell array may include a plurality of memory blocks, each of which is configured to independently perform an erase operation. Each of the memory blocks may include a plurality of memory cells, which are three-dimensionally arranged in the memory cell array, and a plurality of word and bit lines, which are electrically connected to the memory cells.

In each of the row decoder regions ROW DCR, a row decoder may be provided to select at least one of the word lines that are provided in the memory cell array. In the connection region CNR, an interconnection structure may be provided to electrically connect the memory cell array to the row decoder.

In the page buffer region PBR, a page buffer may be provided to read out data stored in the memory cells.

Depending on an operation mode, the page buffer may be configured to temporarily store data in the memory cells or to read out data stored in the memory cells.

A column decoder may be provided in the column decoder region COL DCR and may be connected to the bit lines of the memory cell array. The column decoder may provide data-transmission paths between the page buffer and an external device (e.g., a memory controller).

Figure 2:
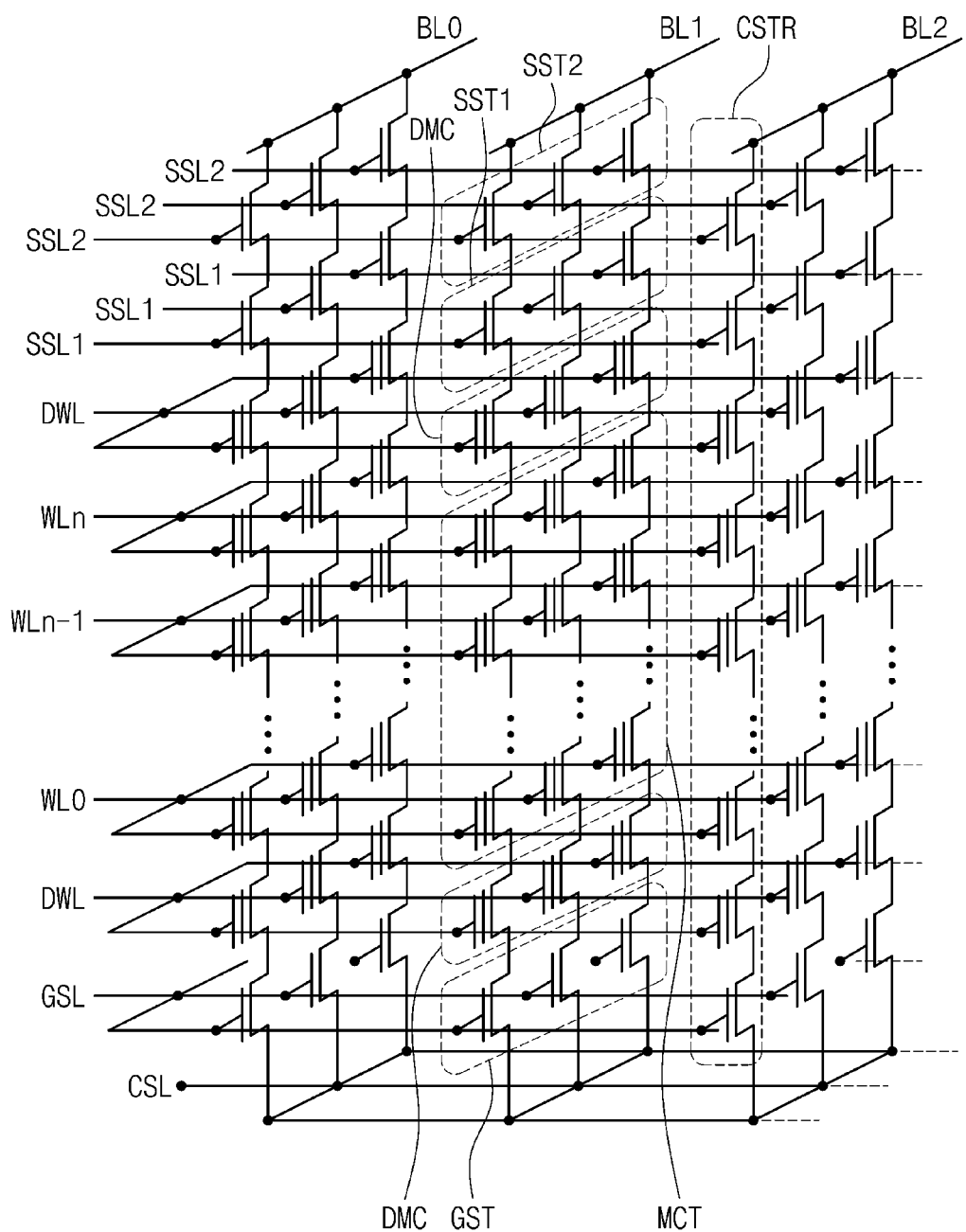
FIG. 2 is a circuit diagram of a memory cell array of a three-dimensional semiconductor memory device according to exemplary embodiments of the inventive concept.

FIG. 2 is a circuit diagram of a memory cell array of a three-dimensional semiconductor memory device according to exemplary embodiments of the inventive concept.

Referring to FIG. 2, a three-dimensional semiconductor memory device according to exemplary embodiments of the inventive concept may include a cell array, in which a common source line CSL, a plurality of bit lines BL0-BL2, and a plurality of cell strings CSTR therebetween are provided.

The bit lines BL0-BL2 may be two-dimensionally arranged, and a plurality of cell strings CSTR may be connected in parallel to each of the bit lines BL0-BL2. The plurality of cell strings CSTR may be connected in common to the common source line CSL. For example, a plurality of cell strings CSTR may be provided between the bit lines BL0-BL2 and the common source line CSL. In exemplary embodiments, a plurality of common source lines CSL may be two-dimensionally arranged. The common source lines CSL may be applied with the same voltage or may be independently controlled.

In exemplary embodiments, each of the cell strings CSTR may include a plurality of string selection transistors SST1 and SST2, which are connected in series to each other, memory cell transistors MCT, which are connected in series to each other, and a ground selection transistor GST. Each of the memory cell transistors MCT may include a data storage element.

As an example, each of the cell strings CSTR may include first and second string selection transistors SST1 and SST2, the second string selection transistor SST2 may be coupled to the bit lines BL0-BL2, and the ground selection transistor GST may be coupled to the common source line CSL. The memory cell transistors MCT may be provided between the first string selection transistor SST1 and the ground selection transistor GST and may be connected in series to each other.

Furthermore, each of the cell strings CSTR may further include a dummy cell transistor DMC that is provided between the first string selection transistor SST1 and the memory cell transistor MCT to connect the first string selection transistor SST1 and the memory cell transistor MCT to each other. Another dummy cell transistor DMC may be provided between the ground selection transistor GST and the memory cell transistor MCT to connect the ground selection transistor GST and the memory cell transistor MCT to each other.

As another example, in each of the cell strings CSTR, the ground selection transistor GST may include a plurality of metal-oxide-semiconductor (MOS) transistors, which are connected in series to each other, similar to the string selection transistors SST1 and SST2. In addition, each of the cell strings CSTR may be configured to have a single string selection transistor.

The first string selection transistor SST1 may be controlled by a first string selection line SSL1, and the second string selection transistor SST2 may be controlled by a second string selection line SSL2. The memory cell transistors MCT may be controlled by a plurality of word lines WL0-WLn, and the dummy cell transistors DMC may be controlled by a dummy word line DWL. The ground selection transistor GST may be controlled by a ground selection line GSL. The common source line CSL may be connected in common to sources of the ground selection transistors GST.

Since each cell string CSTR includes the plurality of the memory cell transistors MCT that are positioned at different heights from the common source lines CSL, the word lines. WL0-WLn and DWL may have a multi-layered structure between the common source lines CSL and the bit lines BL0-BL2.

In addition, gate electrodes of the memory cell transistors MCT, which are disposed at substantially the same height from the common source lines CSL, may be connected in common to one of the word lines WL0-WLn, thereby being in an equipotential state. Alternatively, although the gate electrodes of the memory cell transistors MCT are disposed at substantially the same height from the common source lines CSL, some of them (e.g., those disposed in a different row or column) may be independently controlled.

Figure 3:
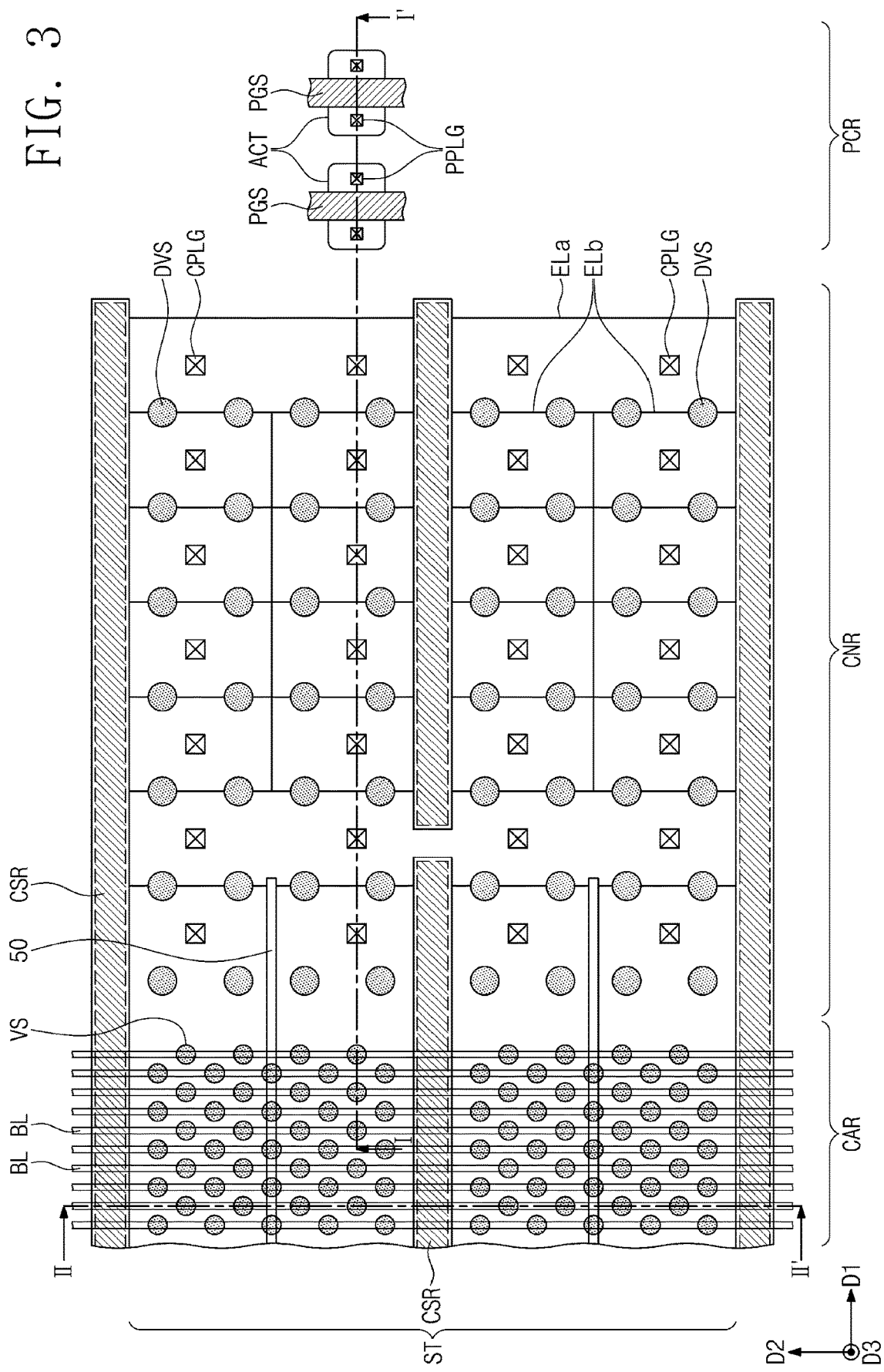
FIG. 3 is a plan view illustrating a three-dimensional semiconductor memory device according to exemplary embodiments of the inventive concept.
Figure 4A:
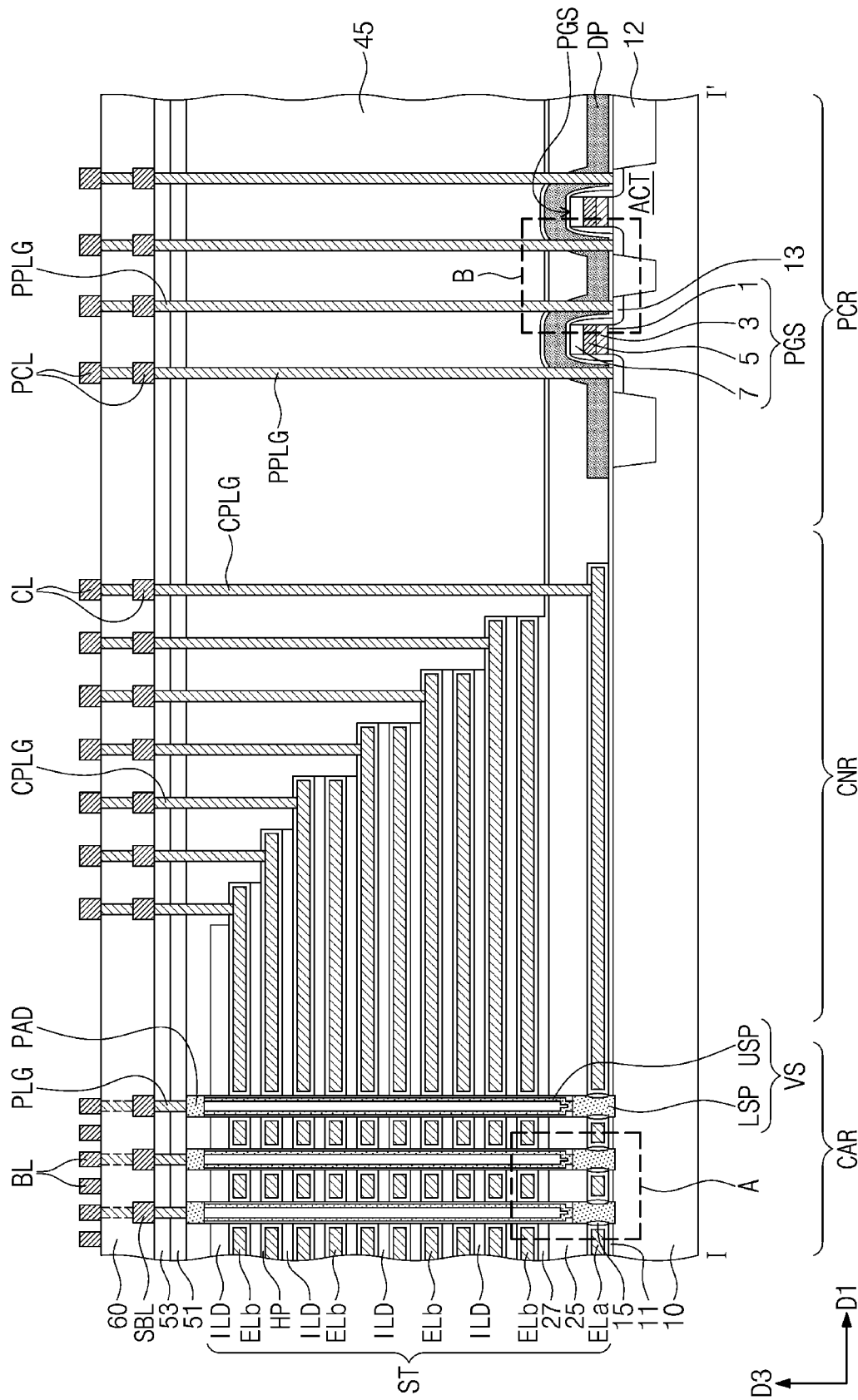
FIGS. 4A and 4B are cross-sectional views illustrating a three-dimensional semiconductor memory device according to exemplary embodiments of the inventive concept, and are taken along lines I-I' and II-II' of FIG. 3, respectively.
Figure 4B:
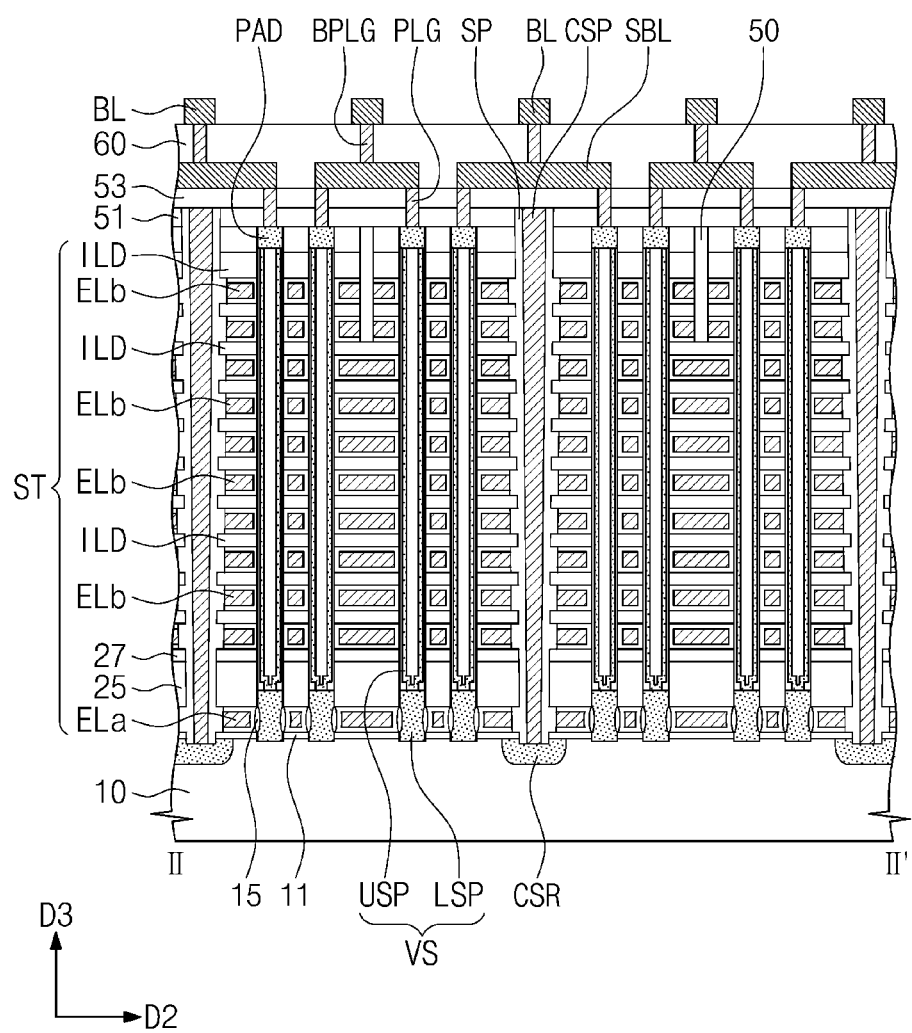
Figure 5:
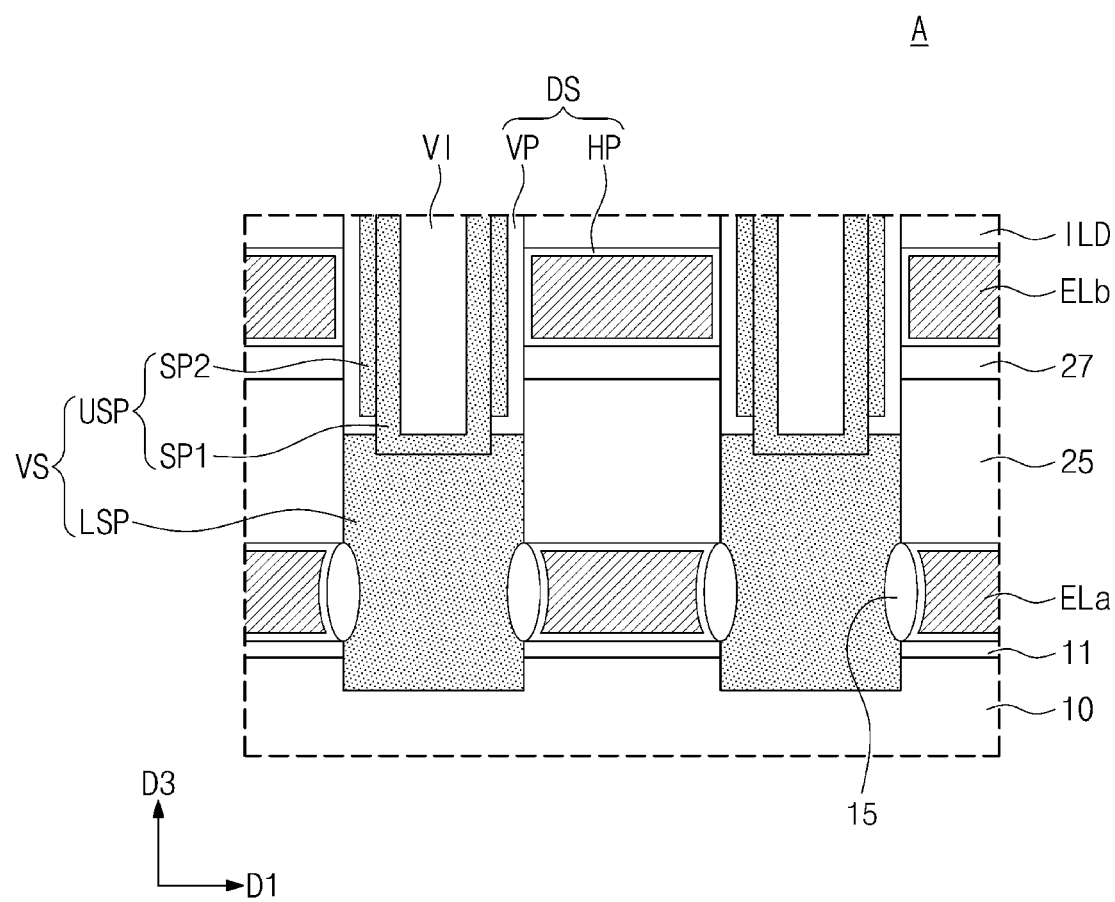
FIG. 5 is an enlarged cross-sectional view of portion 'A' of FIG. 4A according to exemplary embodiments of the inventive concept.
Figure 6A:
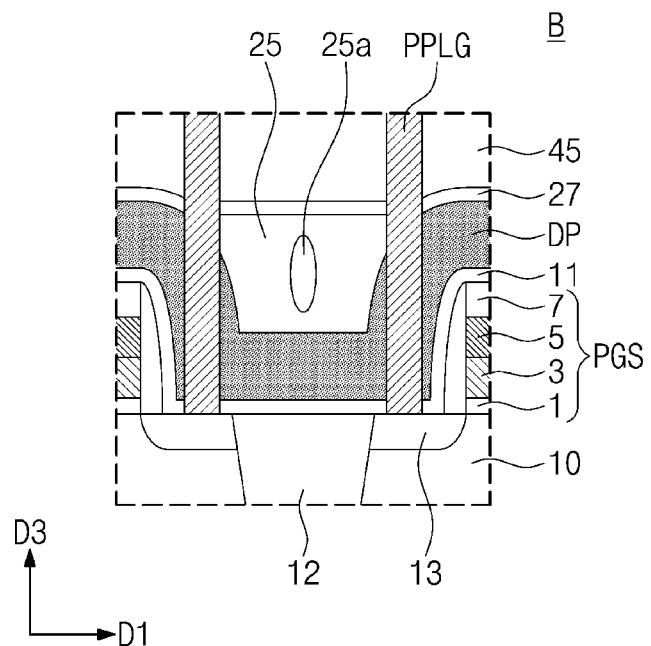
FIGS. 6A and 6B are enlarged cross-sectional views of portion 'B' of FIG. 4A according to exemplary embodiments of the inventive concept.
Figure 6B:
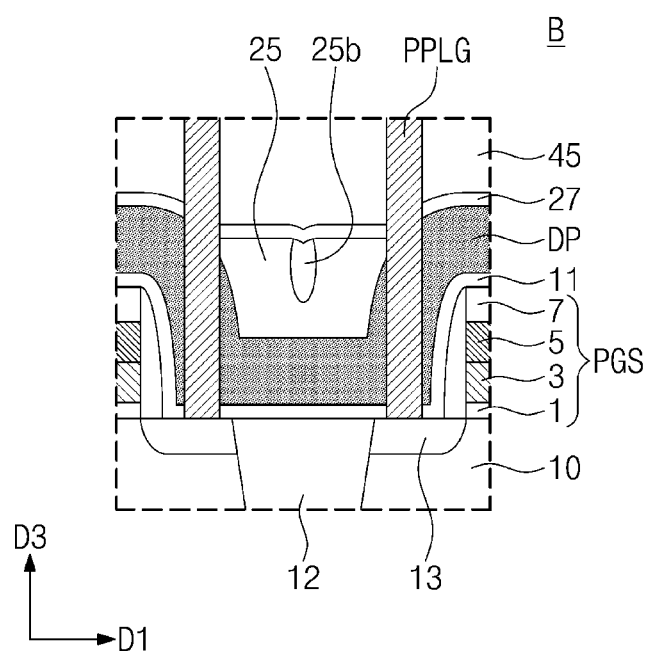

FIG. 3 is a plan view illustrating a three-dimensional semiconductor memory device according to exemplary embodiments of the inventive concept. FIGS. 4A and 4B are cross-sectional views illustrating a three-dimensional semiconductor memory device according to exemplary embodiments of the inventive concept, and are taken along lines I-I' and II-II' of FIG. 3, respectively. FIG. 5 is an enlarged cross-sectional view of portion 'A' of FIG. 4A according to exemplary embodiments of the inventive concept. FIGS. 6A and 6B are enlarged cross-sectional views of portion 'B' of FIG. 4A according to exemplary embodiments of the inventive concept.

Referring to FIGS. 3, 4A, and 4B, a substrate 10 may include a cell array region CAR, a connection region CNR, and a peripheral circuit region PCR. The connection region CNR may be positioned between the cell array region CAR and the peripheral circuit region PCR. The substrate 10 may include at least one of a semiconductor material (e.g., silicon), an insulating material (e.g., glass), or a semiconductor or conductive material covered with an insulating material. For example, the substrate 10 may be a silicon wafer, which is of a first conductivity type.

A peripheral circuit structure may be provided on the peripheral circuit region PCR of the substrate 10, and the peripheral circuit structure may include peripheral logic circuits for writing or reading data to or from memory cells. The peripheral logic circuits may include row and column decoders, a page buffer, and control circuits. The peripheral logic circuits may include, for example, high- or low voltage transistors, resistors, and capacitors.

For example, the peripheral circuit structure may include the peripheral gate stacks PGS that are provided on the peripheral circuit region PCR of the substrate 10 and are spaced apart from each other. The peripheral gate stacks PGS may be provided to cross an active region ACT formed in the peripheral circuit region PCR of the substrate 10. Each of the peripheral gate stacks PGS may include a peripheral gate insulating layer 1, a doped poly-silicon layer 3, a gate metal layer 5, and a hard mask layer 7, which are sequentially stacked on the substrate 10. Spacers may be provided to cover both sidewalls of the peripheral gate stacks PGS, and source and drain impurity regions 13 may be provided in the active region ACT at both sides of the peripheral gate stacks PGS.

An electrode structure ST may be provided on the cell array region CAR of the substrate 10 and may be spaced apart from the peripheral circuit structure. The electrode structure ST may extend from the cell array region CAR to the connection region CNR in a first direction D1, and may have a staircase structure in the connection region CNR. For example, in exemplary embodiments, the electrode structure ST is disposed in the cell array region CAR and the connection region CNR, and has a staircase structure in the connection region CNR. A buffer insulating layer 11 may be interposed between the electrode structure ST and the substrate 10. The buffer insulating layer 11 may be formed of or include a silicon oxide layer, and may be extended to conformally cover the peripheral gate stacks PGS in the peripheral circuit region PCR. For example, in the peripheral circuit region PCR, the buffer insulating layer 11 may be disposed on and cover the peripheral gate stacks PGS.

In exemplary embodiments, the electrode structure ST may include a lower electrode ELa, first and second lower insulating layers 25 and 27, which are sequentially stacked on the lower electrode ELa, and upper electrodes ELb and upper insulating layers ILD, which are alternately stacked on the second lower insulating layer 27. In exemplary embodiments, a sidewall of the second lower insulating layer 27 is substantially aligned with a sidewall of the lowermost one of the upper electrodes ELb. According to exemplary embodiments, the first and second lower insulating layers 25 and 27 may be collectively referred to as a lower insulating layer.

The lower electrode ELa and the upper electrodes ELb may have substantially the same thickness. The lower electrode ELa and the upper electrodes ELb may include at least one of a doped semiconductor (e.g., doped silicon), metals (e.g., tungsten, copper, or aluminum), conductive metal nitrides (e.g., titanium nitride, or tantalum nitride), or transition metals (e.g., titanium, or tantalum). However, the lower electrode ELa and the upper electrodes ELb are not limited thereto.

The lower electrode ELa of the electrode structure ST may extend from the cell array region CAR to the connection region CNR, and may be a line-shaped pattern. For example, a shape of the lower electrode Ela of the electrode structure ST may be a substantially straight line. In exemplary embodiments, the lower electrode ELa may have an opening in the connection region CNR. A height of the lower electrode ELa may be lower than that of the peripheral gate stacks PGS.

As shown in FIG. 4A, a top surface of the lower electrode ELa may be positioned below top surfaces of the peripheral gate stacks PGS, and a bottom surface of the lowermost one of the upper electrode ELb may be positioned above the top surfaces of the peripheral gate stacks PGS. For example, the top surfaces of the peripheral gate stacks PGS may be positioned between the lower electrode ELa and the lowermost one of the upper electrodes ELb.

In exemplary embodiments, the first and second lower insulating layers 25 and 27 may extend from a region between the lower electrode ELa and the lowermost one of the upper electrodes ELb to the peripheral circuit region PCR. For example, the first and second lower insulating layers 25 and 27 may be disposed in the cell array region CAR and the connection region CNR with the lower electrode Ela and the lowermost one of the upper electrodes ELb, and the first and second lower insulating layers 25 and 27 may extend from the connection region CNR into the peripheral circuit region PCR, as shown in FIG. 4A. A distance between the lower electrode ELa and the lowermost one of the upper electrodes ELb may be changed depending on thicknesses of the first and second lower insulating layers 25 and 27. The thicknesses of the first and second lower insulating layers 25 and 27 may be determined or optimized in consideration of a distance between the ground selection line GSL of FIG. 2 and the dummy word line DWL of FIG. 2. The thicknesses of the first and second lower insulating layers 25 and 27 may be controlled to allow the first and second lower insulating layers 25 and 27 to cover the peripheral circuit region PCR and to allow the cell array to have certain technical characteristics (e.g., certain technical characteristics to satisfy requirements of a specific implementation).

The first lower insulating layer 25 may be thicker than the second lower insulating layer 27, and may include a different insulating material from the second lower insulating layer 27. For example, the first lower insulating layer 25 may include a first insulating material, and the second lower insulating layer 27 may include a second insulating material different from the first insulating material. The second lower insulating layer 27 may extend from the cell array region CAR and the connection region CNR into the peripheral circuit region PCR, and the thickness of the second lower insulating layer 27 in the cell array region CAR and the connection region CNR may be different from the thickness of the second lower insulating layer 27 in the peripheral circuit region PCR. For example, the second lower insulating layer 27 may include a first portion and a second portion, which are respectively located below the upper electrodes ELb and in the peripheral circuit region PCR, and the second portion may be thinner than the first portion, as shown in FIG. 4A. For example, in an exemplary embodiment, a first portion of the second lower insulating layer 27 that is disposed below the upper electrodes ELb has a greater thickness than a second portion of the second lower insulating layer 27 that is not disposed below the upper electrodes ELb and that is disposed in the peripheral circuit region PCR. In an exemplary embodiment, a part of the second portion of the second lower insulating layer 27 may be disposed in the connection region CNR.

The first and second lower insulating layers 25 and 27 and the upper insulating layers ILD may be formed of, for example, high-density plasma (HDP) oxide, tetraethylorthosilicate (TEOS), plasma-enhanced tetraethylorthosilicate (PE-TEOS), $O_3$-tetra ethyl ortho silicate ($O_3$-TEOS), undoped silicate glass (USG), phosphosilicate glass (PSG), borosilicate glass (BSG), borophosphosilicate glass (BPSG), fluoride silicate glass (FSG), spin on glass (SOG), tonen silazene (TOSZ), or any combination thereof. As an example, the first lower insulating layer 25 may be formed of HDP oxide, and the second lower insulating layer 27 may be formed of TEOS. The upper insulating layers ILD may be formed of the same insulating material as the second lower insulating layer 27. For example, the first lower insulating layer 25 may include a first insulating material, the second lower insulating layer 27 may include a second insulating material different from the first insulating material, and the upper insulating layers ILD may include the second insulating material.

Referring to FIGS. 3 and 4A, in exemplary embodiments, lengths of the upper electrodes ELb of the electrode structure ST in the first direction D1 may decrease with increasing distance from the substrate 10, and a height of the electrode structure ST may decrease with increasing distance from the cell array region CAR. For example, in exemplary embodiments, lengths of the upper electrodes Elb of the electrode structure ST in the first direction D1 may decrease as the upper electrodes ELb are disposed further away from the substrate 10, and the height of the electrode structure ST in a third direction D3 may decrease as the electrode structure ST is disposed further away from the cell array region CAR.

The electrode structure ST may have staircase structures of various shapes, which are formed in the connection region CNR. As an example, the electrode structure ST may have a first staircase structure, which is defined by end portions of the upper electrodes ELb arranged in the first direction D1 in the connection region CNR, and a second staircase structure, which is defined by end portions of the upper electrodes ELb arranged in a second direction D2. The first staircase structure defined in the first direction D1 may have a slope larger than that of the second staircase structure defined in the second direction D2.

Each of the lower and upper electrodes ELa and ELb may have a pad portion in the connection region CNR, and the pad portions of the lower and upper electrodes ELa and ELb may be located at different positions in horizontal and vertical directions. When viewed in a plan view, the pad portions of odd-numbered ones of the upper electrodes ELb may be arranged in the first direction D1. Similarly, when viewed in a plan view, pad portions of even-numbered ones of the upper electrodes ELb may be arranged in the first direction D1. The pad portions of odd-numbered ones of the upper electrodes ELb may be located adjacent to the pad portions of even-numbered ones of the upper electrodes ELb in the second direction D2. Sidewalls of two adjacent upper electrodes ELb may be vertically aligned with each other. Furthermore, in the electrode structure ST, the upper electrodes ELb located at the highest level may be spaced apart from each other by an insulating separation pattern 50, and may have a line shape extending in the first direction D1.

In exemplary embodiments, a dummy sacrificial pattern DP may conformally cover the peripheral gate stacks PGS in the peripheral circuit region PCR. The dummy sacrificial pattern DP may be formed of or include an insulating material having an etch selectivity with respect to the first and second lower insulating layers 25 and 27. For example, the first lower insulating layer 25 may include a first insulating material, the second lower insulating layer 27 may include a second insulating material different from the first insulating material, and the dummy sacrificial pattern DP may include a third insulating material different from the first and second insulating materials. In exemplary embodiments, the dummy sacrificial pattern DP may be formed of or include a silicon nitride layer.

A portion of the dummy sacrificial pattern DP may be positioned between the first lower insulating layer 25 and the substrate 10, and another portion of the dummy sacrificial pattern DP may be positioned between the second lower insulating layer 27 and the peripheral gate stacks PGS. The topmost surface of the dummy sacrificial pattern DP may be in contact with (e.g., in direct contact with) the second lower insulating layer 27. In addition, the first lower insulating layer 25 may include a portion positioned on the dummy sacrificial pattern DP and between the peripheral gate stacks PGS.

Referring to FIGS. 6A and 6B, the first lower insulating layer 25 may have an air gap 25a or 25b between the peripheral gate stacks PGS. The first lower insulating layer 25 may define the air gap 25a. For example, the air gap 25a may exist within a space included in the first lower insulating layer 25 (e.g., the air gap 25a may be defined by inner surfaces of the space included in the first lower insulating layer 25). According to a thickness of the first lower insulating layer 25, the second lower insulating layer 27 may be spaced apart from the air gap 25a, as shown in FIG. 6A, or may define a top portion of the air gap 25b, as shown in FIG. 6B. For example, in an exemplary embodiment, the first lower insulating layer 25 is disposed between air gap 25a and the second lower insulating layer 27, as shown in FIG. 6A. In an exemplary embodiment, the first lower insulating layer 25 is not disposed between the air gap 25b and the second lower insulating layer 27, as shown in FIG. 6B.

Referring to FIG. 4A, an upper insulating planarization layer 45 may be provided on the substrate 10 and may cover the electrode structure ST, as well as the second lower insulating layer 27 in the peripheral circuit region PCR. The upper insulating planarization layer 45 may have a substantially flat top surface and may have the largest thickness in the peripheral circuit region PCR. For example, the thickness of the upper insulating planarization layer 45 may vary, and may be the greatest in the peripheral circuit region PCR. The upper insulating planarization layer 45 may include a single insulating layer or a plurality of stacked insulating layers (e.g., a silicon oxide layer and/or a low-k dielectric layer).

A plurality of vertical structures VS may penetrate the electrode structure ST in the cell array region CAR and may be connected to the substrate 10. The vertical structures VS may be arranged in a row or in a zigzag manner when viewed in a plan view. Furthermore, dummy vertical structures DVS may be formed in the connection region CNR, and may have substantially the same structure as the vertical structures VS. The dummy vertical structures DVS may penetrate the end portions of the upper and lower electrodes ELb and ELa.

The vertical structures VS and the dummy vertical structures DVS may be formed of or include at least one of semiconductor materials (e.g., silicon (Si), germanium (Ge), or mixtures thereof). In addition, the vertical structures VS may be formed of or include a doped semiconductor material or an intrinsic semiconductor material. The vertical structures VS containing the semiconductor material may be used as channel regions of the string selection transistors SST1 and SST2, the ground selection transistors GST, and the memory cell transistors MCT described with reference to FIG. 2.

Each of the vertical structures VS and the dummy vertical structures DVS may include a lower semiconductor pattern LSP and an upper semiconductor pattern USP. For example, referring to FIG. 5, the lower semiconductor pattern LSP may be an epitaxial layer formed by a selective epitaxial growth (SEG) process, in which the portion of the substrate 10 exposed by vertical holes is used as a seed layer. The lower semiconductor pattern LSP may be a pillar-shaped pattern filling a lower region of each of the vertical holes. A top surface of the lower semiconductor pattern LSP may be positioned above a top surface of the lower electrode ELa. In exemplary embodiments, the top surface of the lower semiconductor pattern LSP may be positioned between the top surface of the lower electrode ELa and the bottom surface of the lowermost one of the upper electrodes ELb.

The lower semiconductor pattern LSP may be formed to have a single- or poly-crystalline structure. However, exemplary embodiments of the inventive concept are not limited thereto. The lower semiconductor pattern LSP may be formed of, for example, carbon nano structures, organic semiconductor materials, and/or compound semiconductor materials. The lower semiconductor pattern LSP may have the same conductivity type as the substrate 10.

The upper semiconductor pattern USP may be in contact with the lower semiconductor pattern LSP. For example, as shown in FIG. 5, the upper semiconductor pattern USP may include a first semiconductor pattern SP1 and a second semiconductor pattern SP2. The first semiconductor pattern SP1 may be coupled to the lower semiconductor pattern LSP and may be shaped like a bottom-closed pipe or macaroni. An inner space of the first semiconductor pattern SP1 may be filled with an insulating gapfill pattern VI. In addition, the first semiconductor pattern SP1 may be in contact with an inner surface of the second semiconductor pattern SP2 and the top surface of the lower semiconductor pattern LSP. For example, the first semiconductor pattern SP1 may electrically connect the second semiconductor pattern SP2 to the lower semiconductor pattern LSP. The second semiconductor pattern SP2 may be shaped like a hollow pipe or macaroni whose top and bottom are open. The second semiconductor pattern SP2 may be spaced apart from the lower semiconductor pattern LSP. For example, in exemplary embodiments, the second semiconductor pattern SP2 and the lower semiconductor pattern LSP are not in contact with each other.

The upper semiconductor pattern USP may be in an undoped state or may be doped to have the same conductivity type as the substrate 10. The upper semiconductor pattern USP may be formed of or include at least one of silicon (Si), germanium (Ge), or compounds thereof. In addition, the upper semiconductor pattern USP may have one of single-crystalline, amorphous, and poly-crystalline structures. A conductive pad PAD may be formed on a top portion of each of the upper semiconductor patterns USP, as shown in FIG. 4A. The conductive pad PAD may be a doped impurity region or may be formed of a conductive material.

Referring to FIG. 5, a vertical insulating pattern VP may be provided between the electrode structure ST and the upper semiconductor pattern USP. The vertical insulating pattern VP may extend in the third direction D3 and may surround a side surface of the upper semiconductor pattern USP. For example, the vertical insulating pattern VP may be shaped like a hollow pipe or macaroni whose top and bottom are open.

The vertical insulating pattern VP may include a single layer or a plurality of layers. In exemplary embodiments, the vertical insulating pattern VP may be used as a part of a data storing layer DS. For example, the vertical insulating pattern VP may include a tunnel insulating layer, a charge storing layer, and a blocking insulating layer, which are used as the data storing layer DS of a NAND flash memory device. For example, the charge storing layer may be a trap insulating layer, a floating gate electrode, or an insulating layer with conductive nano dots. The charge storing layer may include, for example, at least one of a silicon nitride layer, a silicon oxynitride layer, a silicon-rich nitride layer, a nanocrystalline silicon layer, or a laminated trap layer. The tunnel insulating layer may be formed of at least one of materials whose band gaps are greater than that of the charge storing layer, and the blocking insulating layer may be formed of a high-k dielectric material (e.g., aluminum oxide and hafnium oxide). In exemplary embodiments, the vertical insulating layer may include a phase-change or variable-resistance layer.

A horizontal insulating pattern HP may be provided between side surfaces of the lower and upper electrodes ELa and ELb and the vertical insulating pattern VP. The horizontal insulating pattern HP may partially cover side surfaces of the lower and upper electrodes ELa and ELb, and may extend to cover top and bottom surfaces of the lower and upper electrodes ELa and ELb. A portion of the horizontal insulating pattern HP may extend from a region between a gate insulating layer 15 and the lower electrode ELa to cover top and bottom surfaces of the lower electrode ELa. The gate insulating layer 15 may be provided on a side surface of the lower semiconductor pattern LSP. The horizontal insulating pattern HP may be used as a part of the data storing layer DS of a NAND flash memory device, and may include a charge storing layer and a blocking insulating layer. In exemplary embodiments, the horizontal insulating pattern HP may include a blocking insulating layer.

Referring to FIGS. 3, 4A, and 4B, common source regions CSR may extend substantially parallel to the electrode structures ST (e.g., extend in the first direction D1), and may be formed by doping the substrate 10 with impurities of a second conductivity type. The common source regions CSR may contain, for example, n-type impurities (e.g., arsenic (As) or phosphorus (P)).

A common source plug CSP may be provided between the electrode structures ST, and may be coupled to the common source region CSR. As an example, the common source plug CSP may extend in the first direction D1 and may have a substantially uniform upper width. Insulating spacers SP may be interposed between the common source plug CSP and both side surfaces of the electrode structures ST. Alternatively, the common source plug CSP may be provided between the insulating spacers SP and may be locally coupled to the common source region CSR.

A first interlayered insulating layer 51 may be provided on the upper insulating planarization layer 45 and may cover top surfaces of the vertical structures VS. A second interlayered insulating layer 53 may be provided on the first interlayered insulating layer 51 and may cover top surfaces of the common source plugs CSP.

Cell contact plugs CPLG may penetrate the first and second interlayered insulating layers 51 and 53 and the upper insulating planarization layer 45, and may be coupled to pad portions of the upper electrodes ELb, respectively. One of the cell contact plugs CPLG may penetrate the first and second interlayered insulating layers 51 and 53, the upper insulating planarization layer 45, the first lower insulating layer 25, and the second lower insulating layer 27, and may be coupled to an end portion of the lower electrode ELa. Vertical lengths of the cell contact plugs CPLG may decrease with decreasing distance from the cell array region CAR. For example, vertical lengths of the cell contact plugs CPLG (e.g., lengths in the third direction D3) may decrease as the cell contact plugs CPLG are disposed closer to the cell array region CAR. Top surfaces of the cell contact plugs CPLG may be substantially coplanar with each other.

Peripheral contact plugs PPLG may penetrate the first and second interlayered insulating layers 51 and 53, the upper insulating planarization layer 45, the first lower insulating layer 25, the second lower insulating layer 27, and the dummy sacrificial pattern DP, and may be coupled to the peripheral circuit structure. For example, the peripheral contact plugs PPLG may be coupled to the source and drain impurity regions 13 and the peripheral gate stacks PGS.

Sub-bit lines SBL may be provided on the second interlayered insulating layer 53 in the cell array region CAR, and may be electrically connected to the vertical structures VS through contact plugs PLG. Connection lines CL may be provided on the second interlayered insulating layer 53 in the connection region CNR, and may be coupled to the cell contact plugs CPLG. Peripheral circuit lines PCL may be provided on the second interlayered insulating layer 53 in the peripheral circuit region PCR, and may be coupled to the peripheral contact plugs PPLG.

A third interlayered insulating layer 60 may be provided on the second interlayered insulating layer 53 and may cover the sub-bit lines SBL, the connection lines CL, and the peripheral circuit lines PCL. Bit lines BL may be provided on the third interlayered insulating layer 60, and may cross the electrode structure ST and extend in the second direction D2. The bit lines BL may be coupled to the sub-bit lines SBL through bit line contact plugs BPLG.

Figure 7:
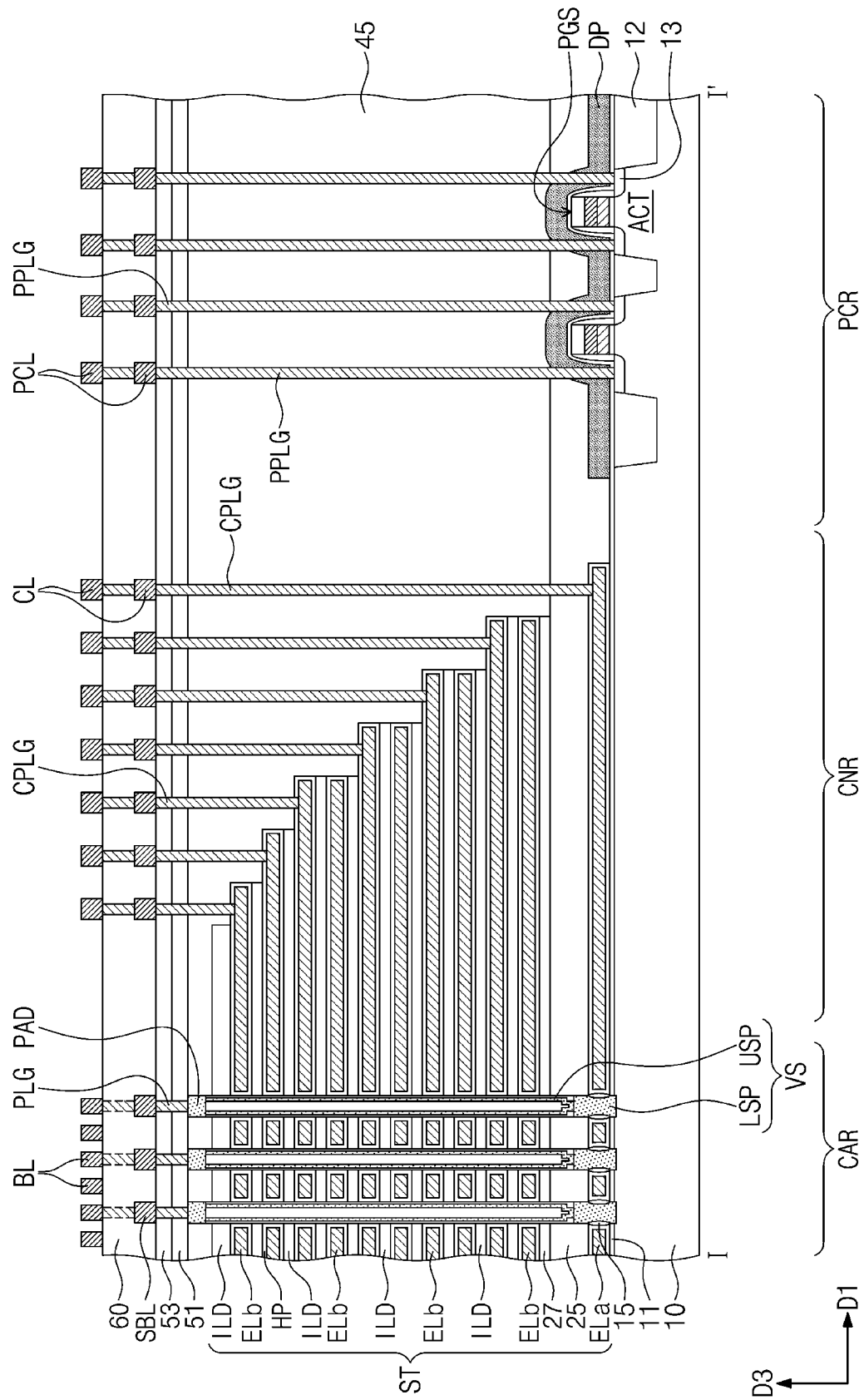
FIG. 7 is a cross-sectional view taken along line I-I' of FIG. 3, and illustrates a three-dimensional semiconductor memory device according to exemplary embodiments of the inventive concept.
Figure 8:
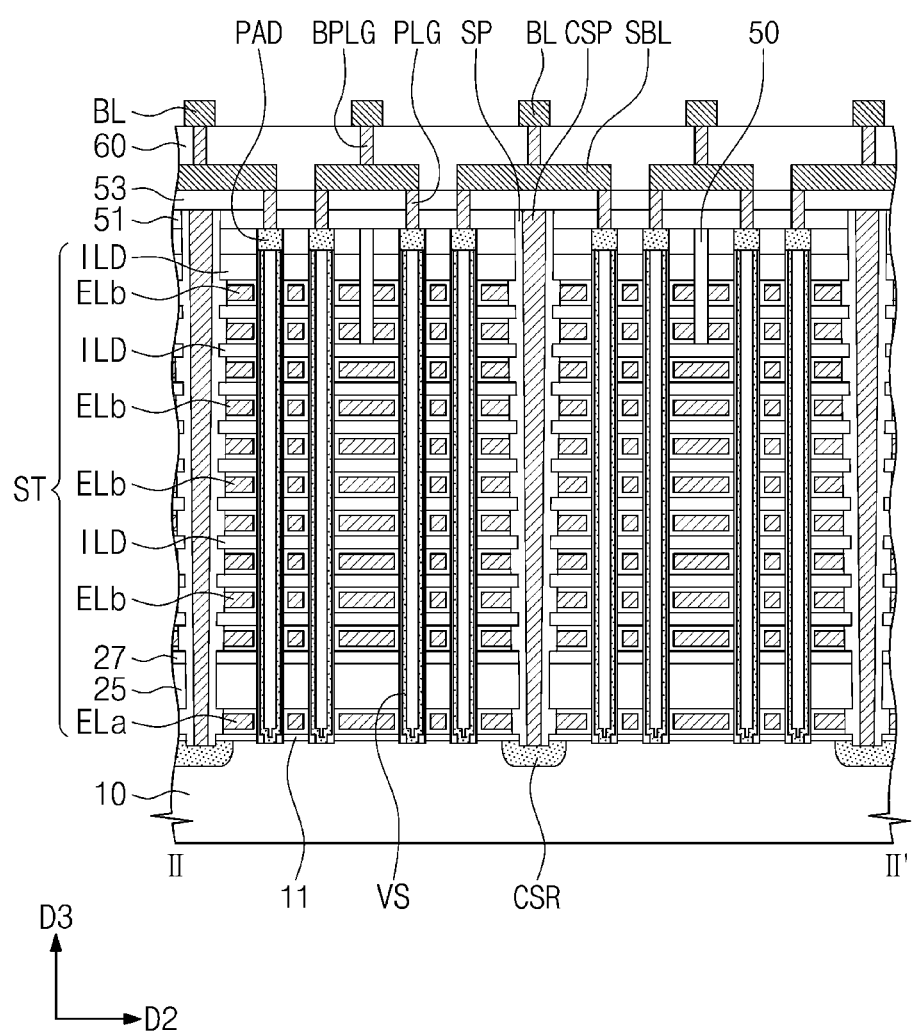
FIG. 8 is a cross-sectional view taken along line II-II' of FIG. 3, and illustrates a three-dimensional semiconductor memory device according to exemplary embodiments of the inventive concept.
Figure 9:
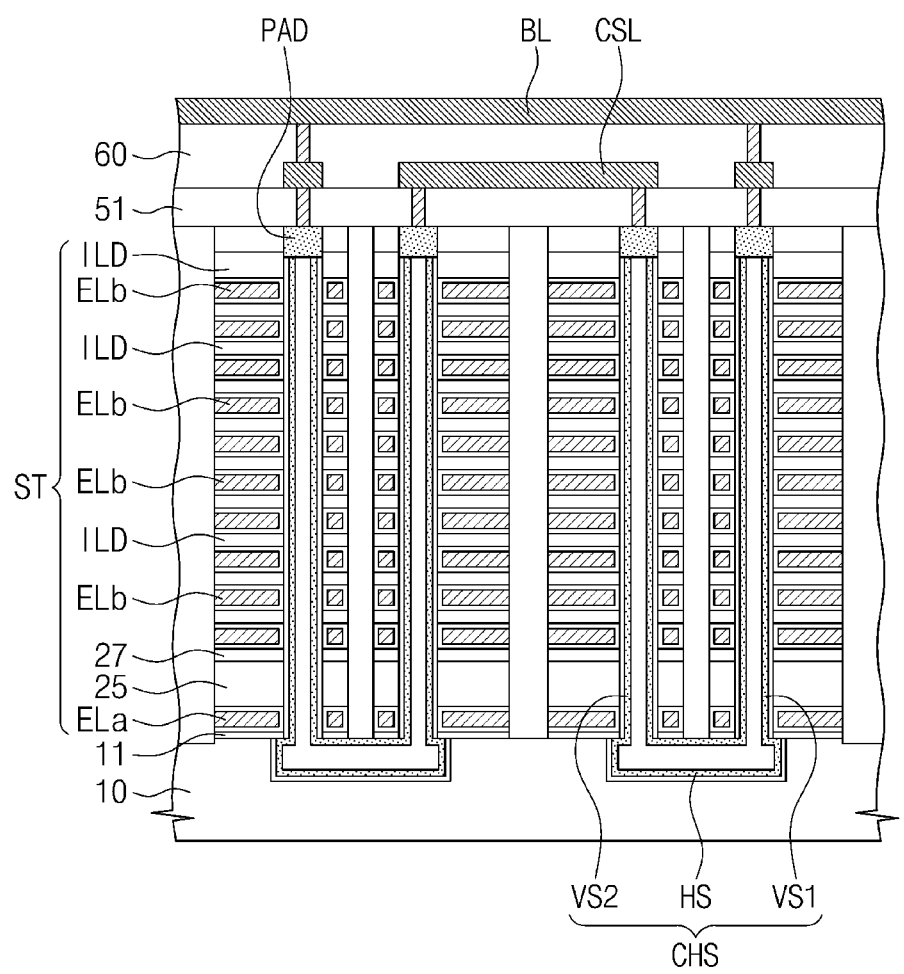
FIG. 9 is a cross-sectional view illustrating a three-dimensional semiconductor memory device according to exemplary embodiments of the inventive concept.

FIG. 7 is a cross-sectional view taken along line I-I' of FIG. 3, and illustrates a three-dimensional semiconductor memory device according to exemplary embodiments of the inventive concept. FIG. 8 is a cross-sectional view taken along line II-II' of FIG. 3, and illustrates a three-dimensional semiconductor memory device according to exemplary embodiments of the inventive concept. FIG. 9 is a cross-sectional view illustrating a three-dimensional semiconductor memory device according to exemplary embodiments of the inventive concept. For convenience of explanation, a further description of elements previously described with reference to FIGS. 3, 4A, and 4B may be omitted.

Referring to FIG. 7, the first and second lower insulating layers 25 and 27 may be provided between the lower electrode ELa and the lowermost ones of the upper electrodes ELb. The second lower insulating layer 27 may be thinner than the first lower insulating layer 25, and may be formed of an insulating material different from that of the first lower insulating layer 25. For example, the first lower insulating layer 25 may include a first insulating material, and the second lower insulating layer 27 may include a second insulating material different from the first insulating material.

In the exemplary embodiment shown in FIG. 7, the first lower insulating layer 25 extends from the cell array region CAR into the peripheral circuit region PCR and covers the peripheral circuit structure in the peripheral circuit region PCR. Further, the second lower insulating layer 27 does not extend from the cell array region CAR into the peripheral circuit region PCR, and has a side surface substantially aligned with a side surface of the lowermost one of the upper electrodes ELb. In this case, the upper insulating planarization layer 45 may be in direct contact with portions of the dummy sacrificial pattern DP.

Referring to FIG. 8, in an exemplary embodiment, the lower semiconductor pattern LSP of the vertical structures VS shown in FIGS. 4A and 4B is omitted, and the upper semiconductor pattern USP is in direct contact with the substrate 10.

Referring to FIG. 9, in an exemplary embodiment, channel structures CHS may penetrate the electrode structure ST in the cell array region CAR. In exemplary embodiments, each of the channel structures CHS may include first and second vertical channels VS1 and VS2, which penetrate the electrode structure ST, and a horizontal channel HS, which is provided below the electrode structure ST and connects the first and second vertical channels VS1 and VS2 to each other. The first and second vertical channels VS1 and VS2 may be provided in vertical holes penetrating the electrode structure ST. The horizontal channel HS may be provided in a recess region, which is formed in an upper portion of the substrate 10. The horizontal channel HS may be provided between the substrate 10 and the electrode structure ST, and may connect the first and second vertical channels VS1 and VS2 to each other.

In exemplary embodiments, the horizontal channel HS may be a hollow pattern (e.g., shaped like a pipe or macaroni), which is continuously connected to the first and second vertical channels VS1 and VS2. For example, the first and second vertical channels VS1 and VS2 and the horizontal channel HS may be connected to form a single pipe-shaped structure. For example, the first and second vertical channels VS1 and VS2 and the horizontal channel HS may be a single continuous semiconductor pattern that is substantially absent of any interface. The semiconductor layer may have, for example, one of single-crystalline, amorphous, and poly-crystalline structures. Furthermore, as described above, the data storing layer may be interposed between the channel structures CHS and the lower and upper electrodes ELa and ELb.

In exemplary embodiments, the first vertical channel VS1 of each channel structure CHS may be connected to the bit line BL, and the second vertical channel VS2 may be connected to the common source line CSL. The channel structures CHS containing a semiconductor material may be electrically disconnected from each other, and an electric potential of each of the channel structures CHS may be controlled by a voltage applied by the electrode structure ST. Each of the channel structures CHS may be used as a current path between the bit line BL and the common source line CSL.

Figure 10:
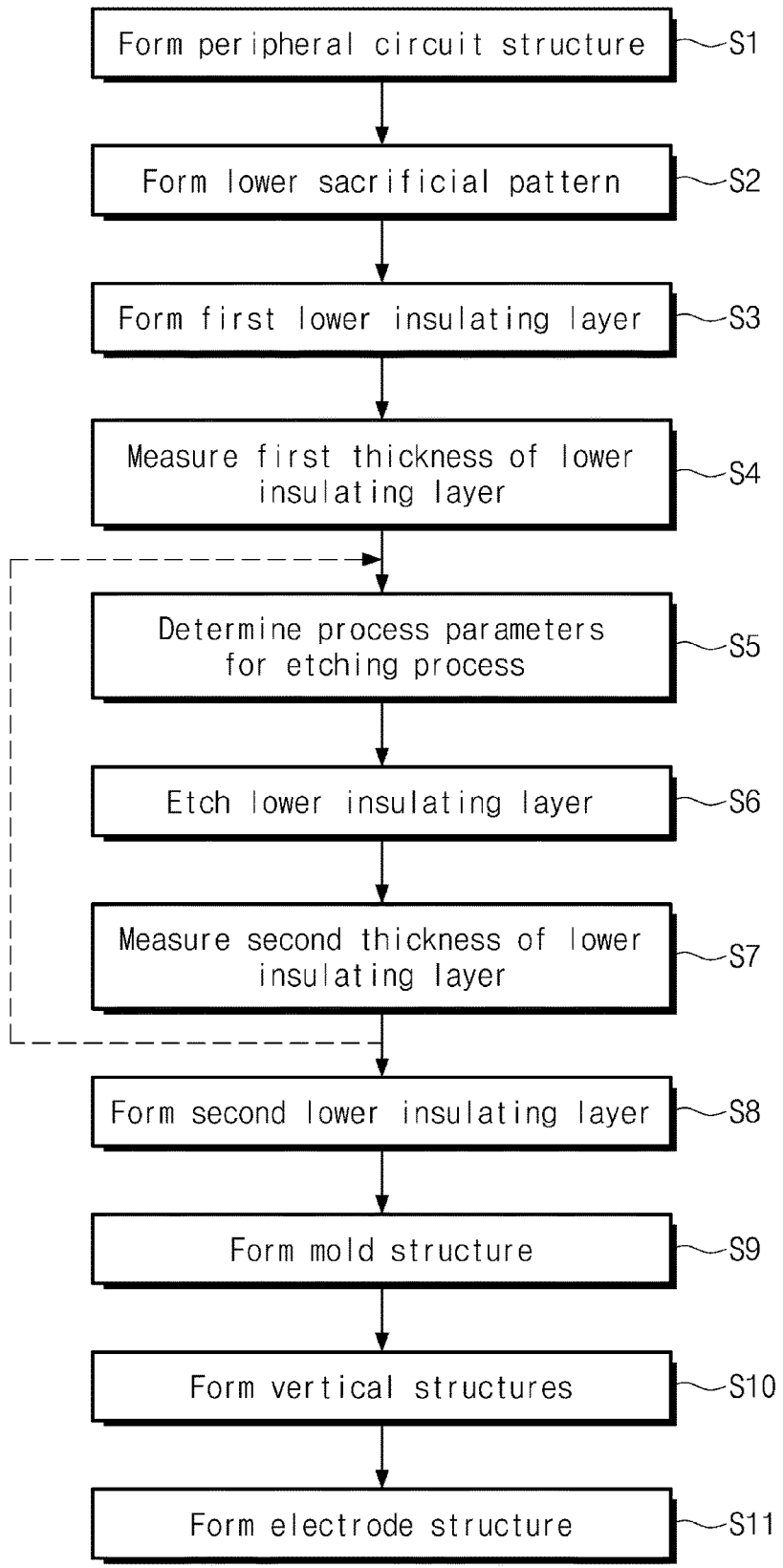
FIG. 10 is a flow chart illustrating a method of fabricating a three-dimensional semiconductor memory device according to exemplary embodiments of the inventive concept.

FIG. 10 is a flow chart illustrating a method of fabricating a three-dimensional semiconductor memory device according to exemplary embodiments of the inventive concept. FIGS. 11A to 11J are cross-sectional views taken along line I-I' of FIG. 3, and illustrate a method of fabricating a three-dimensional semiconductor memory device according to exemplary embodiments of the inventive concept.

Figure 11A:
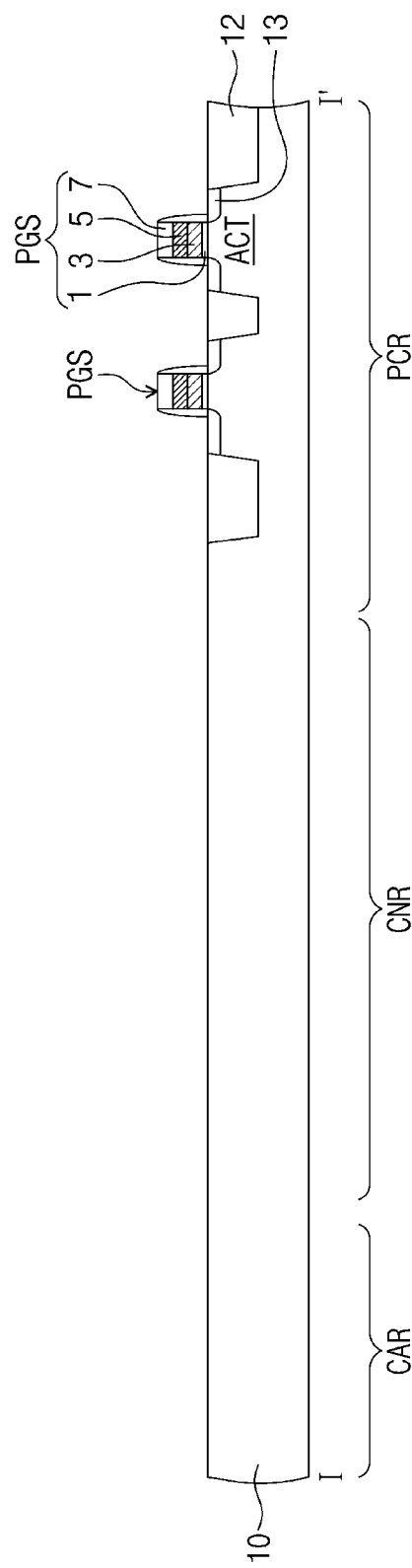

Referring to FIGS. 3, 10, and 11A, a peripheral circuit structure may be formed in a peripheral circuit region PCR of a substrate 10 (S1).

For example, a device isolation layer 12 may be formed in the peripheral circuit region PCR, and may define active regions ACT in the substrate 10. The device isolation layer 12 may be formed by forming a trench in the peripheral circuit region PCR of the substrate 10 and filling the trench with an insulating material.

Peripheral gate stacks PGS may be formed on the substrate 10, and may cross the active regions ACT in the peripheral circuit region PCR. Each of the peripheral gate stacks PGS may be formed by sequentially stacking a peripheral gate insulating layer 1, a doped poly-silicon layer 3, a gate metal layer 5, and a hard mask layer 7 on the substrate 10, and then patterning the layers. Spacers may be formed to cover side surfaces of each of the peripheral gate stacks PGS, and source and drain impurity regions 13 may be formed by doping the active regions ACT with first impurities (e.g., boron (B) or phosphorus (P)). In exemplary embodiments, the peripheral gate stacks PGS may be used as an ion mask in the doping process for forming the source and drain impurity regions 13.

Figure 11B:
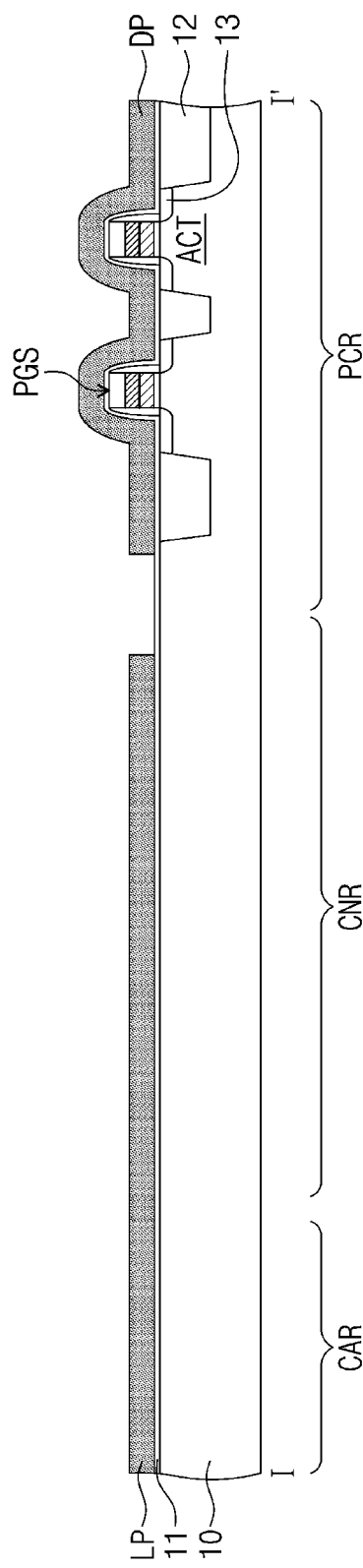

Referring to FIGS. 3, 10, and 11B, a lower sacrificial layer may be deposited on the substrate 10, and then may be patterned to form a lower sacrificial pattern LP and a dummy sacrificial pattern DP (S2).

For example, the formation of the lower sacrificial pattern LP and the dummy sacrificial pattern DP may include forming a mask pattern on the lower sacrificial layer to have an opening on the peripheral circuit region PCR, and then, anisotropically etching the lower sacrificial layer using the mask pattern as an etch mask. The opening of the mask pattern may be formed to be spaced apart from the peripheral gate stacks PGS. Furthermore, before the formation of the lower sacrificial layer, a buffer insulating layer 11 may be formed to cover the substrate 10 provided with the peripheral gate stacks PGS. The buffer insulating layer 11 may include a portion, which is interposed between the lower sacrificial layer and the substrate 10, and another portion, which is interposed between the lower sacrificial layer and the peripheral gate stacks PGS. The buffer insulating layer 11 may be a silicon oxide layer, which is formed by, for example, a thermal oxidation process or a deposition process.

The lower sacrificial layer may be formed to conformally cover the top surface of the substrate 10 and the peripheral gate stacks PGS. In exemplary embodiments, the lower sacrificial layer may be formed to have a thickness less than a vertical thickness of the peripheral gate stacks PGS. In a case in which the peripheral gate stacks PGS are formed to be adjacent to each other, the lower sacrificial layer in the peripheral circuit region PCR may fill a space between the peripheral gate stacks PGS. The lower sacrificial layer may be formed of or include a material having an etch selectivity with respect to the buffer insulating layer 11. For example, the lower sacrificial layer may be formed of or include at least one of silicon nitride, silicon oxynitride, silicon carbide, or silicon germanium.

In exemplary embodiments, the lower sacrificial pattern LP may be a plate-shaped structure, which is provided to cover the substrate 10 in the cell array region CAR and the connection region CNR, or a line-shaped structure, which is provided to extend from the cell array region CAR into the connection region CNR, or may have an opening on the connection region CNR.

The dummy sacrificial pattern DP may be formed to cover the substrate 10 and the peripheral gate stacks PGS in the peripheral circuit region PCR, and the lower sacrificial pattern LP may be formed to cover the substrate 10 in the cell array region CAR and the connection region CNR.

Referring to FIGS. 3, 10, and 11C, a lower insulating layer 20 may be formed to cover the substrate 10 (S3).

The lower insulating layer 20 may have a uniform thickness and may be deposited on the lower sacrificial pattern LP and the dummy sacrificial pattern DP. The lower insulating layer 20 may be a silicon oxide layer (e.g., HDP oxide).

A top surface of the lower insulating layer 20 in the cell array region CAR may be positioned above the uppermost top surface of the dummy sacrificial pattern DP in the peripheral circuit region PCR. In exemplary embodiments, the top surface of the lower insulating layer 20 in the cell array region CAR may be positioned below the uppermost top surface of the dummy sacrificial pattern DP in the peripheral circuit region PCR.

Due to a difference in thickness between the peripheral gate stacks PGS and the lower sacrificial pattern LP, the top surface of the lower insulating layer 20 may be uneven in the peripheral circuit region PCR. For example, the lower insulating layer 20 may have a substantially flat top surface in the cell array region CAR and the connection region CNR, but may have a protrusion portion 20P in the peripheral circuit region PCR. Accordingly, the top surface of the lower insulating layer 20 may be higher in the peripheral circuit region PCR than in the cell array region CAR.

Referring to FIGS. 3, 10, and 11C to 11E, a planarization process including operations S4, S5, S6, and S7 may be performed on the lower insulating layer 20 to form a first lower insulating layer 25. The first lower insulating layer 25 may be formed by, for example, an advanced process control (APC) method. For example, an APC system may be connected to fabrication or measurement equipment for performing a semiconductor fabrication process (e.g., etching, deposition, or polishing processes) or for measuring the result of the process, and the semiconductor fabrication process may be controlled by the APC system.

The thickness of the first lower insulating layer 25 may be determined or optimized in consideration of a distance between the ground selection line GSL and the dummy word line DWL adjacent thereto (e.g., see FIG. 2). For example, as previously described with reference to FIGS. 4A and 4B, a distance between the lower electrode ELa and the lowermost one of the upper electrodes ELb may be determined depending on the thickness of the first lower insulating layer 25.

For example, after the formation of the lower insulating layer 20, an etch stop pattern 30 may be formed to cover the lower insulating layer 20 in the cell array region CAR and the connection region CNR and to expose the lower insulating layer 20 in the peripheral circuit region PCR. The formation of the etch stop pattern 30 may include conformally depositing an etch stop layer on the lower insulating layer 20, and then patterning the etch stop layer to expose the lower insulating layer 20 in the peripheral circuit region PCR. For example, the etch stop pattern 30 may be formed to expose the protrusion portion 20P of the lower insulating layer 20 in the peripheral circuit region PCR. The etch stop pattern 30 may be formed of a material (e.g., silicon nitride or silicon oxynitride) having an etch selectivity with respect to the lower insulating layer 20.

After the formation of the etch stop pattern 30, a polishing process may be performed on the lower insulating layer 20 to remove the protrusion portion 20P of the lower insulating layer 20. As a result of the removal of the protrusion portion 20P, a difference in height of the top surface of the lower insulating layer 20 between the cell array region CAR and the peripheral circuit region PCR may be reduced. The polishing process may be performed using, for example, a chemical mechanical polishing (CMP) process. A slurry (e.g., silica- and/or ceria-based slurry) having an etch selectivity with respect to the etch stop pattern 30 may be used for the CMP process on the lower insulating layer 20.

During the CMP process, the etch stop pattern 30 may be used to detect a stopping point of the CMP process or may be used as an etch stop layer. Thus, the lower insulating layer 20 may be prevented from being exposed in the cell array region CAR and the connection region CNR in the CMP process. For example, a thickness of the lower insulating layer 20 in the cell array region CAR and the connection region CNR may be prevented from being changed during the planarization process performed on the lower insulating layer 20.

After the CMP process, the etch stop pattern 30 may be removed using an etch recipe having an etch selectivity with respect to the lower insulating layer 20. Accordingly, the lower insulating layer 20 exposed in the cell array region CAR and the connection region CNR may have a substantially uniform thickness.

Referring to FIGS. 10 and 11D, a first measurement process may be performed to measure a first thickness T1 of the lower insulating layer 20 in the cell array region CAR (S4). The first measurement process may be performed using measurement equipment, and information regarding the first thickness T1 measured by the measurement equipment may be transmitted to the APC system.

In exemplary embodiments, the first measurement process of measuring the first thickness T1 of the lower insulating layer 20 may be performed directly after the deposition of the lower insulating layer 20. For example, a thickness of the lower insulating layer 20 may be measured by the first measurement process before forming the etch stop pattern 30 described with reference to FIG. 11C.

To obtain a desired thickness (e.g., a target thickness) of the lower insulating layer 20 in the cell array region CAR, the APC system may determine at least one process parameter for the etching process on the lower insulating layer 20 based on the measurement information regarding the first thickness T1 of the lower insulating layer 20 (S5). The process parameters may include, for example, a process time for the etching process, an amount of etchants, a mixture ratio of etchants, etc.

Referring to FIGS. 10 and 11E, the etching process may be performed on the lower insulating layer 20 based on the process parameters determined by the APC system (S6). The etching of the lower insulating layer 20 may be performed to isotropically etch the entire top surface of the lower insulating layer 20 (e.g., using a wet etching method). Accordingly, the thickness of the lower insulating layer 20 may be reduced throughout the substrate 10 to form the first lower insulating layer 25 exposing the topmost surface of the dummy sacrificial pattern DP in the peripheral circuit region PCR. A portion of the first lower insulating layer 25 may be disposed between the peripheral gate stacks PGS and on the dummy sacrificial pattern. A top surface of the first lower insulating layer 25 may be located at a level that is substantially equal to or lower than the topmost surface of the dummy sacrificial pattern DP. For example, in exemplary embodiments, the first lower insulating layer 25 does not extend above the topmost surface of the dummy sacrificial pattern DP.

A second measurement process may be performed to measure a second thickness T2 of the lower insulating layer 20 in the cell array region CAR, or to determine an etched amount of the lower insulating layer 20 in the etching process (S7).

After the second measurement process, the APC system may compare the measured value of the second thickness T2 with the target thickness to control the etching process on the lower insulating layer 20. If the measured value of the second thickness T2 is beyond a target thickness range, the process parameters for the etching process may be re-determined using the measured value of the second thickness T2, and an etching process may be performed on the lower insulating layer 20 again. If the measured value of the second thickness T2 is within the target thickness range, a second lower insulating layer 27 may be deposited on the first lower insulating layer 25 (S8).

Referring to FIGS. 3, 10, and 11F, the second lower insulating layer 27 may be deposited to have a substantially uniform thickness throughout the substrate 10. The second lower insulating layer 27 may cover the top surface of the dummy sacrificial pattern DP. The second lower insulating layer 27 may be formed of an insulating layer (e.g., TEOS) that is different from that of the first lower insulating layer 25.

In exemplary embodiments, the first or second lower insulating layer 25 or 27 may be formed to reduce a height difference between the cell array region CAR and the peripheral circuit region PCR. For example, the second lower insulating layer 27 may be formed to have a substantially flat top surface.

Figure 11G:
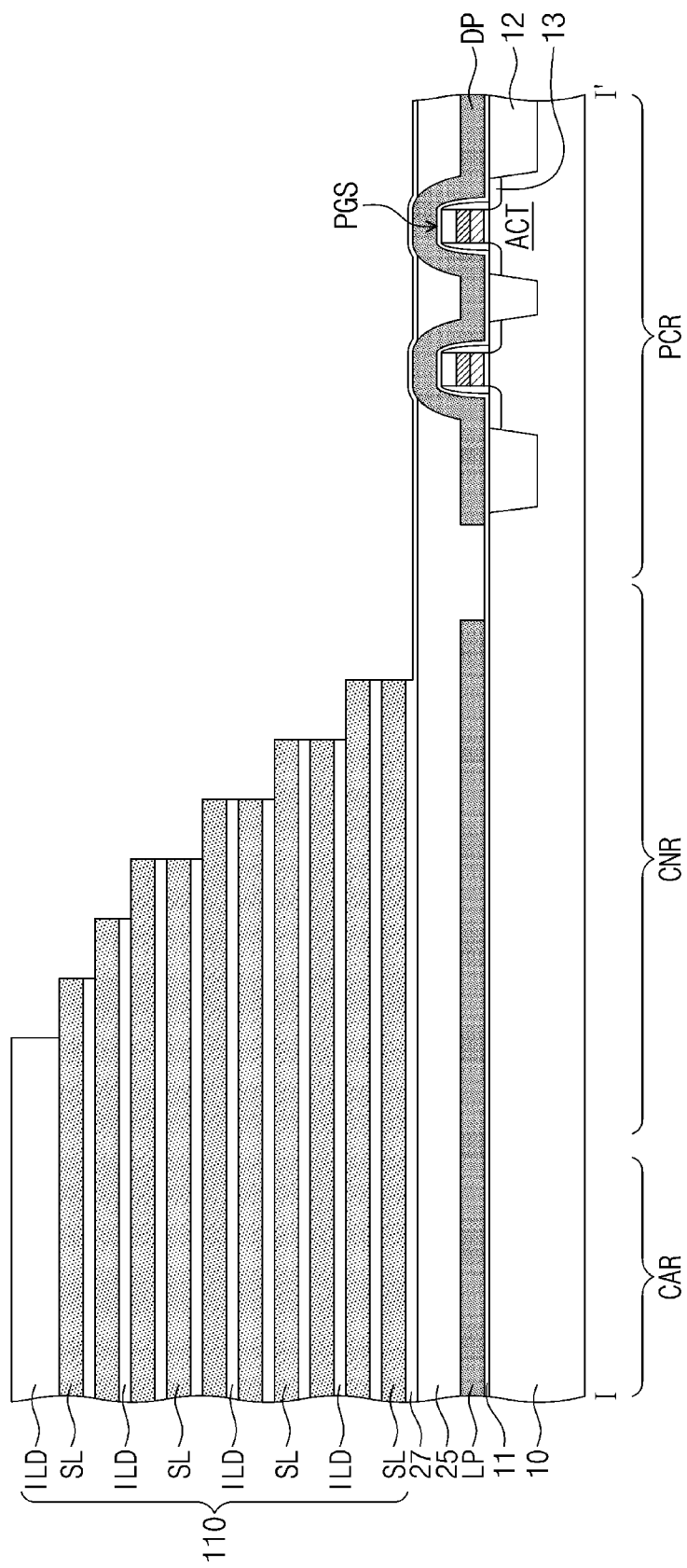

Referring to FIGS. 3, 10, and 11G, a mold structure 110, in which upper sacrificial layers SL and upper insulating layers ILD are vertically and alternately stacked, may be formed on the second lower insulating layer 27 (S9).

For example, the formation of the mold structure 110 may include forming a layered structure, in which the upper sacrificial layers SL and the upper insulating layers ILD are alternately stacked, on the second lower insulating layer 27, and performing a trimming process on the layered structure. The trimming process may include steps of forming a mask pattern covering the layered structure in the cell array region CAR and the connection region CNR, etching the layered structure using the mask pattern as an etch mask, etching the mask pattern to reduce a planar area of the mask pattern, and removing the mask pattern. The steps of etching the layered structure and the mask pattern may be repeated several times before the step of removing the mask pattern. As a result of the trimming process, the mold structure 110 may have a staircase structure having a height that decreases in a step-wise manner in a direction from the connection region CNR toward the peripheral circuit region PCR.

The upper sacrificial layers SL of the mold structure 110 may be formed of a material which can be etched with a high etch selectivity with respect to the upper insulating layers ILD. As an example, the upper sacrificial layers SL and the upper insulating layers ILD may be formed of insulating materials having an etch selectivity with respect to each other. For example, the upper sacrificial layers SL may be formed of an insulating material different from the upper insulating layers ILD. Furthermore, the upper sacrificial layers SL may be formed of the same material as the lower sacrificial pattern LP, and the upper insulating layers ILD may be formed of the same material as the second lower insulating layer 27. For example, the upper sacrificial layers SL may be formed of a silicon nitride layer, and the upper insulating layers ILD may be formed of a TEOS layer.

In exemplary embodiments, the mold structure 110 may be formed in such a way that the lowermost layer of the upper sacrificial layers SL is in contact with the second lower insulating layer 27. Furthermore, the second lower insulating layer 27, which is exposed by the lowermost layer of the upper sacrificial layers SL, may be partially recessed during the trimming process for forming the mold structure 110. Accordingly, a thickness of the second lower insulating layer 27 may be decreased in the peripheral circuit region PCR. In exemplary embodiments, during the trimming process for forming the mold structure 110, a portion of the second lower insulating layer 27, which is exposed by the lowermost one of the upper sacrificial layers SL, may be etched to partially expose the first lower insulating layer 25 in the peripheral circuit region PCR, as described with reference to FIG. 7. In exemplary embodiments, the second lower insulating layer 27 is omitted. When the second lower insulating layer 27 is omitted, the lowermost one of the upper sacrificial layers SL may be in contact with the first lower insulating layer 25 throughout the entire region of the substrate 10.

Figure 11H:
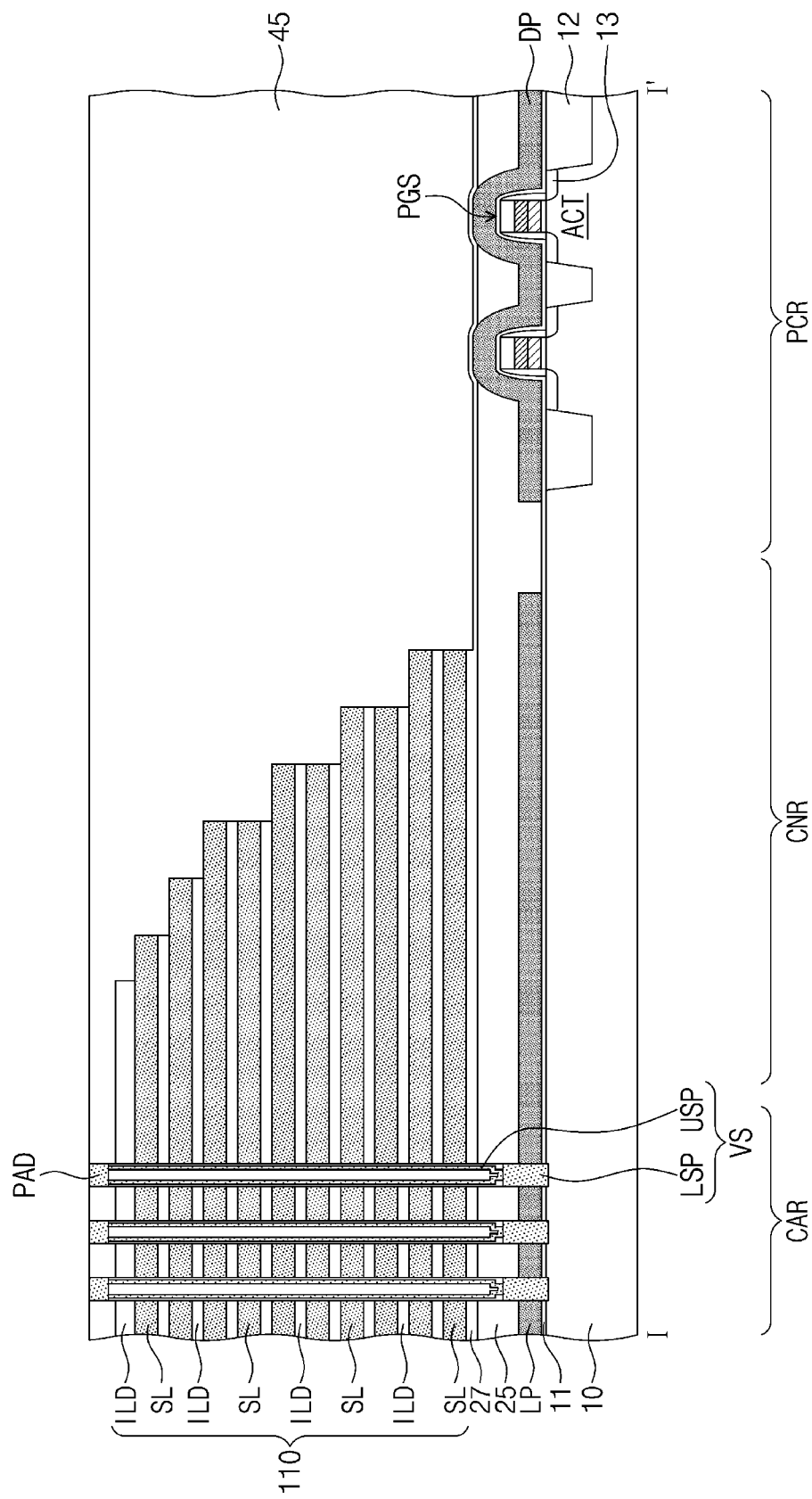

Referring to FIGS. 3, 10, and 11H, an upper insulating planarization layer 45 may be formed on the substrate 10. The upper insulating planarization layer 45 may be formed to have a substantially flat top surface. The upper insulating planarization layer 45 may be formed by forming an insulating gapfill layer, which is thicker than the mold structure 110, on the substrate 10, and then performing a planarization process on the insulating gapfill layer.

After the formation of the upper insulating planarization layer 45, vertical structures VS may be formed in the cell array region CAR to penetrate the mold structure 110, the second lower insulating layer 27, the first lower insulating layer 25, the lower sacrificial pattern LP, and the buffer insulating layer 11 (S10).

The formation of the vertical structures VS may include forming vertical holes to penetrate the mold structure 110, the second lower insulating layer 27, the lower insulating layer 20, the lower sacrificial pattern LP, and the buffer insulating layer 11 and to expose the substrate 10, and forming a lower semiconductor pattern LSP and an upper semiconductor pattern USP in each of the vertical holes.

The lower semiconductor pattern LSP may be formed, for example, by a selective epitaxial growth (SEG) process, in which the substrate 10 exposed by the vertical holes is used as a seed layer. The lower semiconductor pattern LSP may have a top surface positioned above that of the lower sacrificial pattern LP. In exemplary embodiments, a top surface of the lower semiconductor pattern LSP may be positioned between the top surface of the lower sacrificial pattern LP and the top surface of the first lower insulating layer 25.

The lower semiconductor pattern LSP may be formed to have a single- or poly-crystalline structure. However, exemplary embodiments of the inventive concept are not limited thereto. The lower semiconductor pattern LSP may be formed of, for example, carbon nano structures, organic semiconductor materials, and/or compound semiconductor materials. The lower semiconductor pattern LSP may have the same conductivity type as the substrate 10. The lower semiconductor pattern LSP may be doped in situ during the selective epitaxial growth process. Alternatively, the lower semiconductor pattern LSP may be doped by an additional ion implantation process after the formation of the lower semiconductor pattern LSP.

The upper semiconductor pattern USP may be formed in the vertical hole provided with the lower semiconductor pattern LSP. The upper semiconductor pattern USP may be in contact with the lower semiconductor pattern LSP. The upper semiconductor pattern USP may be formed by uniformly depositing a semiconductor layer in the vertical holes. The semiconductor layer may be formed to have a conformal thickness, but in some situations, may be too thin to fill the vertical holes completely. Accordingly, the upper semiconductor patterns USP may define empty or gap regions, which are located in the vertical holes and are filled with an insulating gapfill layer or a gaseous material. In addition, a conductive pad PAD may be formed in or on a top portion of each of the upper semiconductor patterns USP. The conductive pad PAD may be a doped impurity region or may be formed of a conductive material.

In exemplary embodiments, before the formation of the upper semiconductor pattern USP, a vertical insulating pattern VP may be formed in the vertical hole, as described with reference to FIG. 5. The formation of the vertical insulating pattern VP may include uniformly depositing a vertical insulating layer and a first semiconductor layer to conformally cover inner surfaces of the vertical holes provided with the lower semiconductor pattern LSP, and performing an anisotropic etching process on the vertical insulating layer and the first semiconductor layer until the lower semiconductor patterns LSP are partially exposed.

Figure 11I:
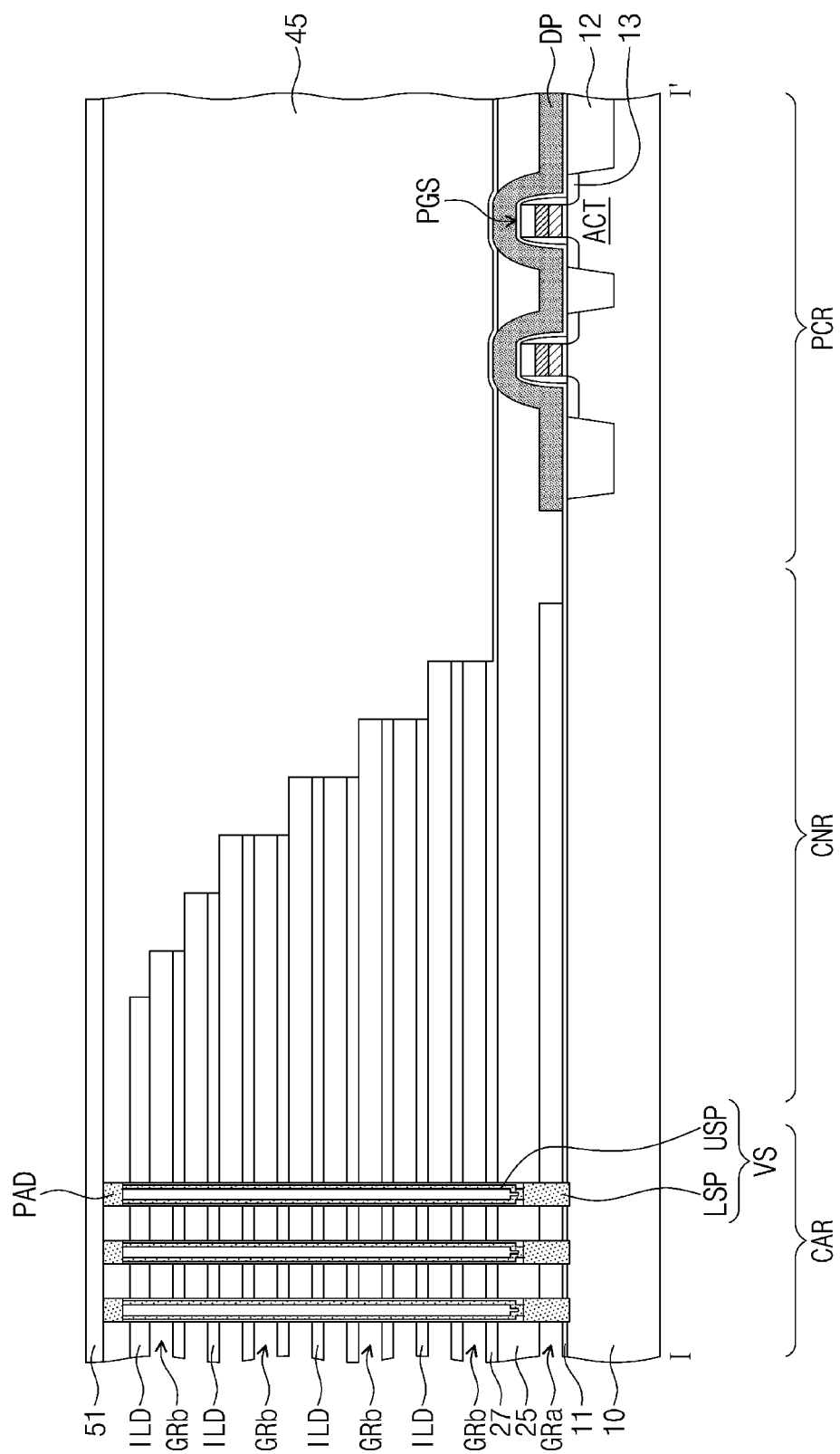

Referring to FIGS. 3, 10, and 11I, a first interlayered insulating layer 51 may be formed on the upper insulating planarization layer 45, and may cover top surfaces of the vertical structures VS. After the formation of the first interlayered insulating layer 51, an electrode structure ST may be formed by a replacement process of replacing the lower sacrificial pattern LP and the upper sacrificial layers SL with electrodes (S11).

For example, after the formation of the first interlayered insulating layer 51, linear trenches may be formed by patterning the first interlayered insulating layer 51, the upper insulating planarization layer 45, the mold structure 110, the first lower insulating layer 25, and the lower sacrificial pattern LP. The trenches may be formed to extend in a first direction D1, and may be spaced apart from each other in a second direction D2 crossing the first direction D1. In exemplary embodiments, the trenches may have at least two different lengths, and as a result of the formation of the trenches, the mold structure 110 may have an 'H' shape, when viewed in a plan view. The trenches may be spaced apart from the vertical structures VS and may be formed to expose sidewalls of the upper sacrificial layers SL and the lower sacrificial pattern LP.

As shown in FIG. 11I, the upper sacrificial layers SL exposed by the trenches may be removed to form upper gate regions GRb, and the lower sacrificial pattern LP may be removed to form a lower gate region GRa. The lower and upper gate regions GRa and GRb may be formed by isotropically etching the upper sacrificial layers SL and the lower sacrificial pattern LP. The isotropic etching process may be performed using an etch recipe that is selected to have an etch selectivity with respect to the buffer insulating layer 11, the first lower insulating layer 25, the upper insulating layers ILD, the vertical structures VS, and the substrate 10. In exemplary embodiments, the isotropic etching process may be performed to completely remove the upper sacrificial layers SL and the lower sacrificial pattern LP. In a case in which the upper sacrificial layers SL and the lower sacrificial pattern LP are formed of silicon nitride, and the buffer insulating layer 11, the first lower insulating layer 25, and the upper insulating layers ILD are formed of silicon oxide, the isotropic etching process may be performed using an etching solution containing phosphoric acid.

The upper gate regions GRb may be gap regions that are formed between vertically adjacent ones of the upper insulating layers ILD, and between the trench and the vertical structure VS. For example, each of the upper gate regions GRb may be formed to partially expose a sidewall of the vertical structure VS. The lower gate region GRa may be a gap region that is formed between the buffer insulating layer 11 and the first lower insulating layer 25 to partially expose a sidewall of the lower semiconductor pattern LSP.

Figure 11J:
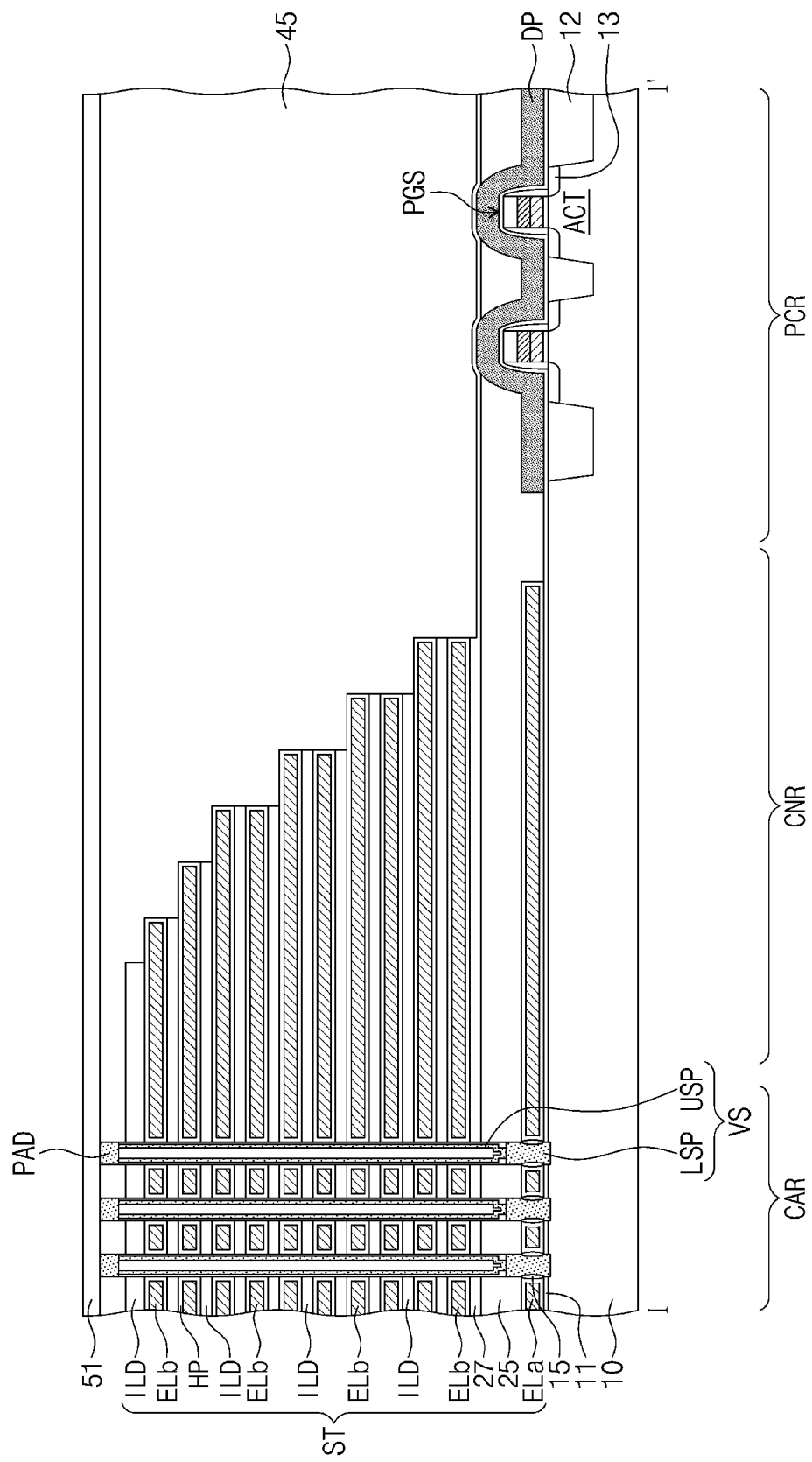

Referring to FIG. 11J, the lower electrode ELa may be formed in the lower gate region GRa and the upper electrodes ELb may be formed in the upper gate regions GRb. The lower and upper electrodes ELa and ELb may be formed to partially or wholly fill the lower and upper gate regions GRa and GRb, respectively. The formation of the lower and upper electrodes ELa and ELb may include sequentially depositing a barrier metal layer and a metal layer. The barrier metal layer may be formed of or include at least one of metal nitride materials (e.g., TiN, TaN, or WN). The metal layer may be formed of or include at least one of metallic materials (e.g., W, Al, Ti, Ta, Co, or Cu).

Before the formation of the lower electrode ELa and the upper electrodes ELb, a horizontal insulating pattern HP may be formed to conformally cover inner surfaces of the lower and upper gate regions GRa and GRb, as shown in FIG. 5. In a NAND flash memory transistor, the horizontal insulating pattern HP may be used as a part of a data storing layer of a memory transistor. Furthermore, before the forming of the horizontal insulating pattern HP, a gate insulating layer 15 may be formed by thermally oxidizing the lower semiconductor pattern LSP exposed by the lower gate region GRa. As a result of the formation of the lower and upper electrodes ELa and ELb, the electrode structure ST may be formed in the cell array region CAR of the substrate 10, and the electrode structure ST may have a staircase structure in the connection region CNR.

Furthermore, common source regions CSR may be formed in the substrate 10 exposed by the trenches. The common source regions CSR may extend substantially parallel to each other in the first direction D1, and may be spaced apart from each other in the second direction D2. The common source regions CSR may be formed, for example, by doping the substrate 10 with impurities that are of a different type from that of the substrate 10. The common source regions CSR may contain, for example, n-type impurities (e.g., arsenic (As) or phosphorus (P)).

After the formation of the electrode structure ST, common source plugs CSP may be formed to be connected to the common source regions CSR, as shown in FIG. 4B. In addition, an insulating spacer SP may be formed between the common source plugs CSP and the electrode structure ST or on sidewalls of the trenches.

A second interlayered insulating layer 53 may be formed on the first interlayered insulating layer 51, and may cover a top surface of the common source plug CSP. Thereafter, contact plugs PLG, cell contact plugs CPLG, and peripheral contact plugs PPLG may be formed in the cell array region CAR, the connection region CNR, and the peripheral circuit region PCR, respectively, as described with reference to FIGS. 4A and 4B.

Thereafter, sub-bit lines SBL, connection lines CL, and peripheral circuit lines PCL may be formed in the cell array region CAR, the connection region CNR, and the peripheral circuit region PCR, respectively. A third interlayered insulating layer 60 may be formed on the second interlayered insulating layer 53, and the bit lines BL may be formed on the third interlayered insulating layer 60.

FIGS. 12A to 12D are cross-sectional views taken along line I-I' of FIG. 3, and illustrate a method of fabricating a three-dimensional semiconductor memory device according to exemplary embodiments of the inventive concept. For convenience of explanation, a further description of elements and processes previously described with reference to FIGS. 11A to 11J may be omitted.

Figure 12A:
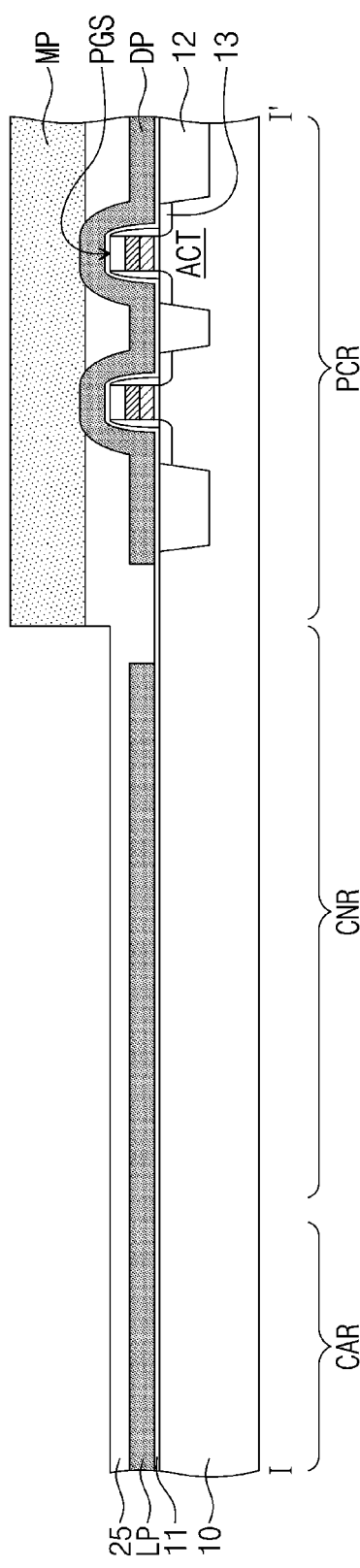

Referring to FIG. 12A, as described with reference to FIG. 11E, the lower insulating layer 20 may be planarized to form the first lower insulating layer 25, and an etching process may then be performed to adjust a thickness of the lower insulating layer 20 in the cell array region CAR and the connection region CNR.

For example, after the formation of the first lower insulating layer 25, a mask pattern MP may be formed to expose the lower insulating layer 20 in the cell array region CAR and the connection region CNR. The first lower insulating layer 25 may be formed by anisotropically etching the lower insulating layer 20 using the mask pattern MP as an etch mask. Accordingly, the first lower insulating layer 25 may be thinner in the cell array region CAR and the connection region CNR than in the peripheral circuit region PCR. For example, the first lower insulating layer 25 may have a first thickness in the cell array region CAR, a second thickness in the peripheral circuit region PCR, and the first thickness may be smaller than the second thickness. For example, the first lower insulating layer 25 may be extended such that it covers the cell array region CAR as well as the peripheral circuit region PCR, and a top surface of the first lower insulating layer 25 may be lower in the cell array region CAR than in the peripheral circuit region PCR. For example, a first height/first thickness of the first lower insulating layer 25 in the cell array region CAR may be smaller than a second height/second thickness of the first lower insulating layer 25 in the peripheral circuit region PCR.

Figure 12B:
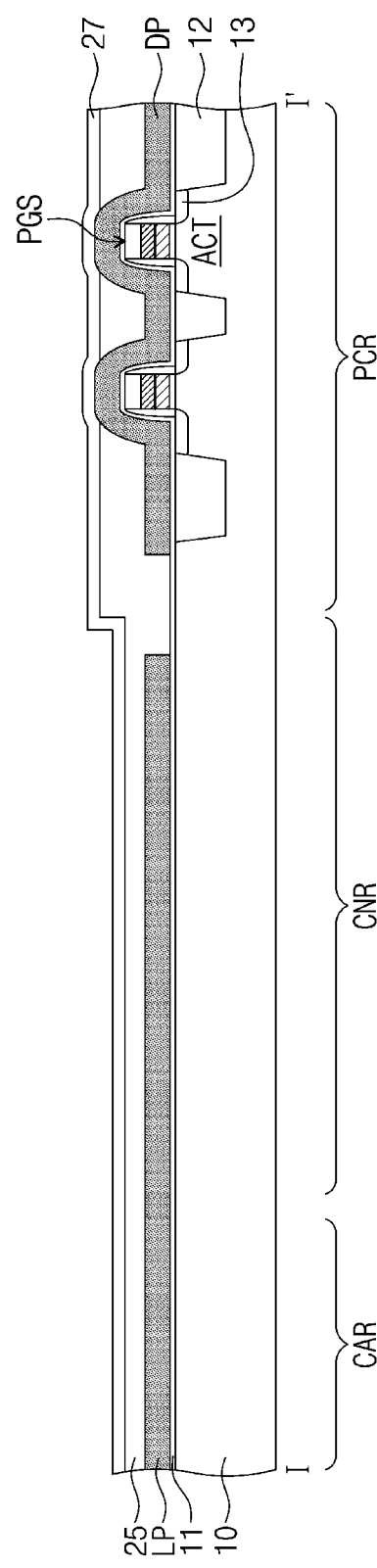

Referring to FIG. 12B, the second lower insulating layer 27 having a uniform thickness may be formed on the first lower insulating layer 25. The second lower insulating layer 27 may be formed to cover the topmost surface of the dummy sacrificial pattern DP.

Figure 12C:
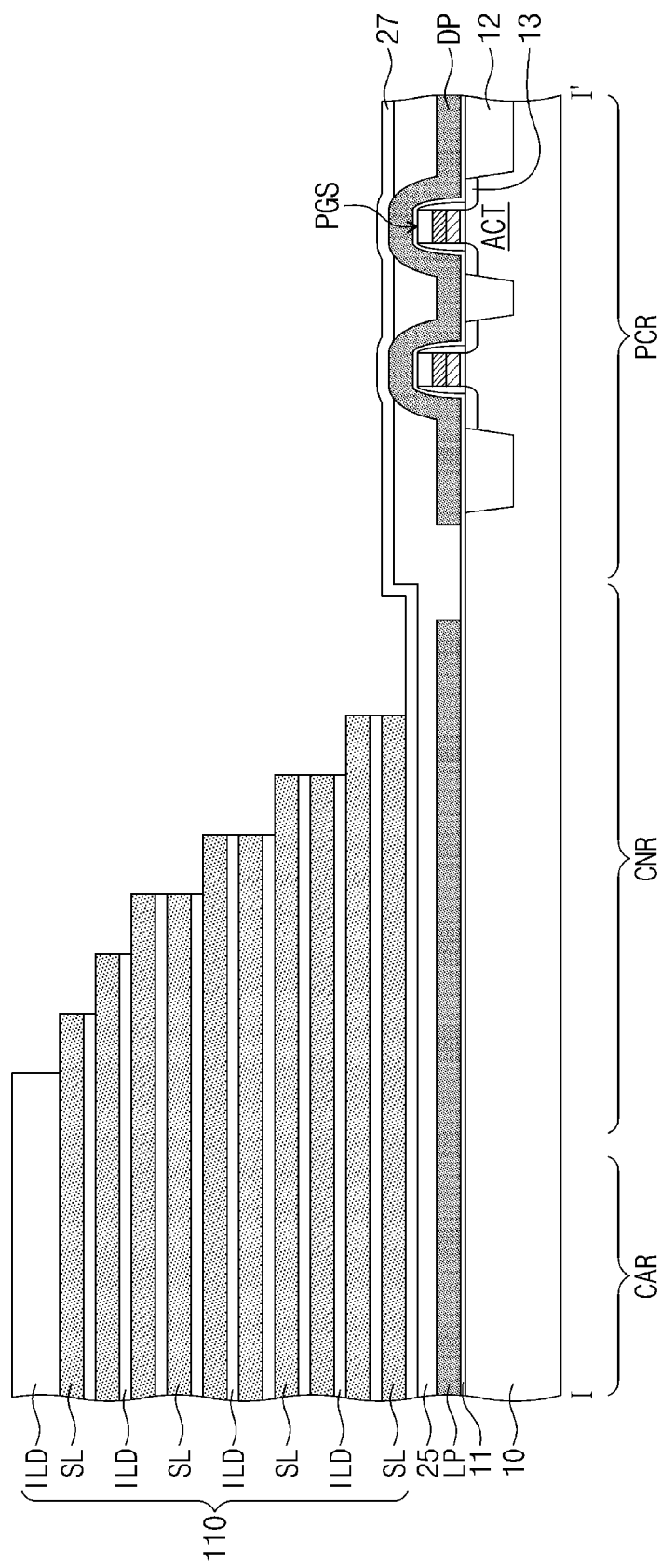

Referring to FIG. 12C, the mold structure 110 may be formed on the second lower insulating layer 27 in the cell array region CAR and the connection region CNR, as previously described with reference to FIG. 11G. Thereafter, the lower sacrificial pattern LP and the upper sacrificial layers SL may be replaced with electrodes, and as a result, the electrode structure ST may be formed, as shown in FIG. 12D.

Figure 12D:
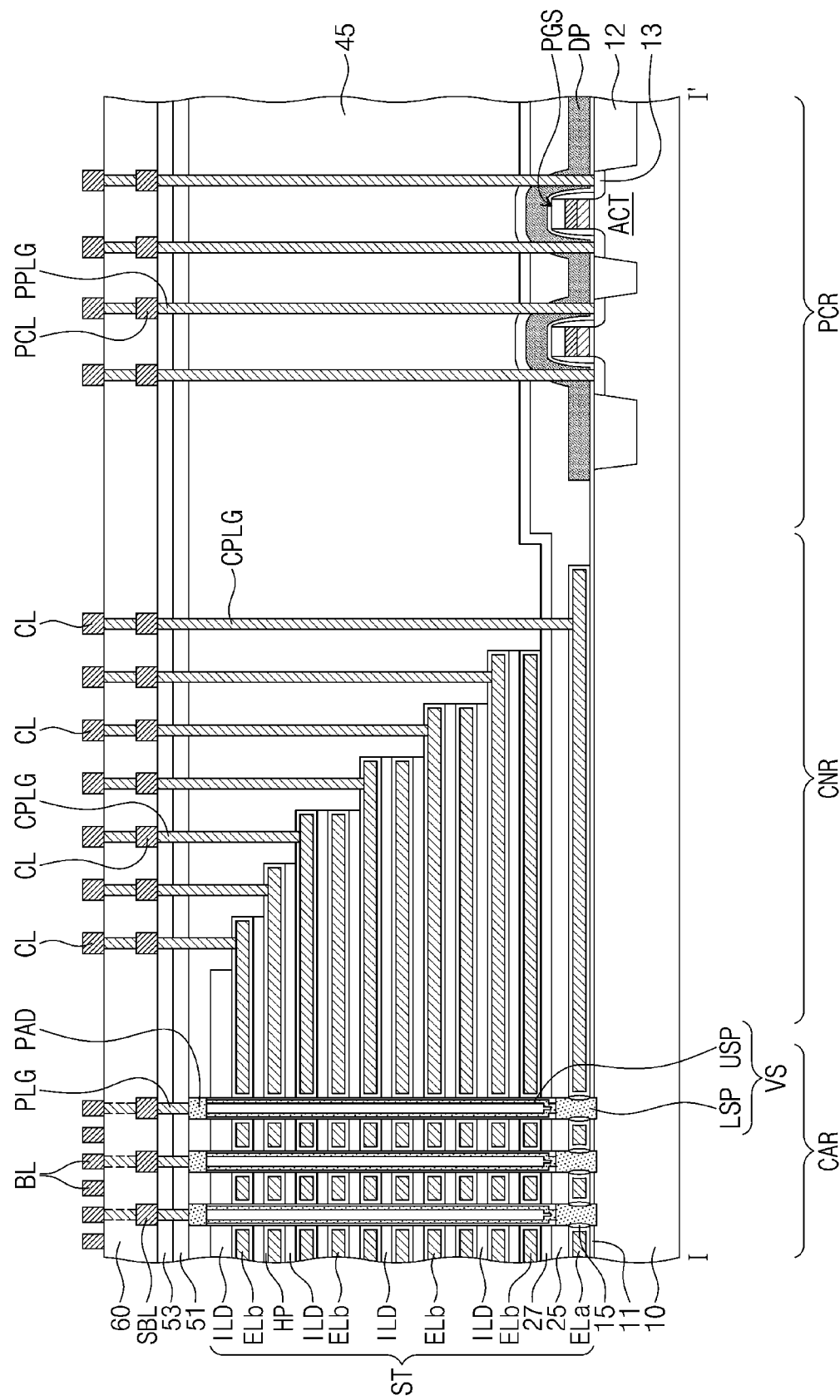

Referring to FIG. 12D, the first and second lower insulating layers 25 and 27 may be provided between the lower electrode ELa and the lowermost one of the upper electrodes ELb, and the first lower insulating layer 25 may be thinner in the cell array region CAR than in the peripheral circuit region PCR. For example, the top surface of the first lower insulating layer 25 in the cell array region CAR may be positioned at a level lower than in the peripheral circuit region PCR. Similarly, the top surface of the second lower insulating layer 27 in the cell array region CAR may be positioned at a level lower than in the peripheral circuit region PCR. A first thickness of the first lower insulating layer 25 in the cell array region CAR is less than a second thickness of the first lower insulating layer 25 in the peripheral circuit region. Further, the topmost surface of the dummy sacrificial pattern DP may be positioned at a level higher than the bottom surface of the lowermost one of the upper electrodes ELb. The second lower insulating layer 27 may be extended to include portions which are placed between the first lower insulating layer 25 and the lowermost one of the upper electrodes ELb and between the dummy sacrificial pattern DP and the upper insulating planarization layer 45.

Figure 13A:
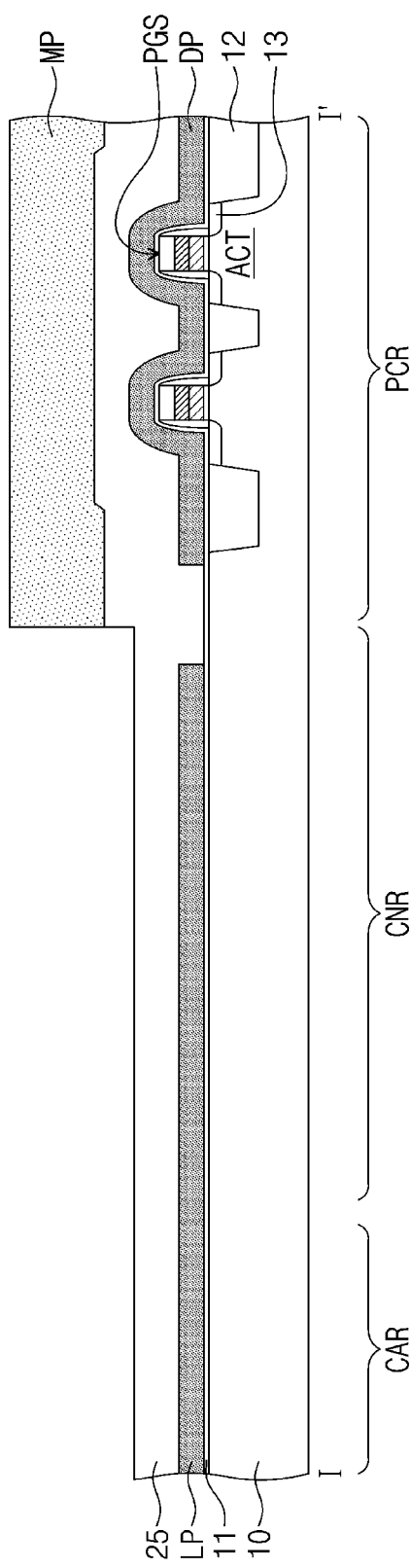
Figure 13B:
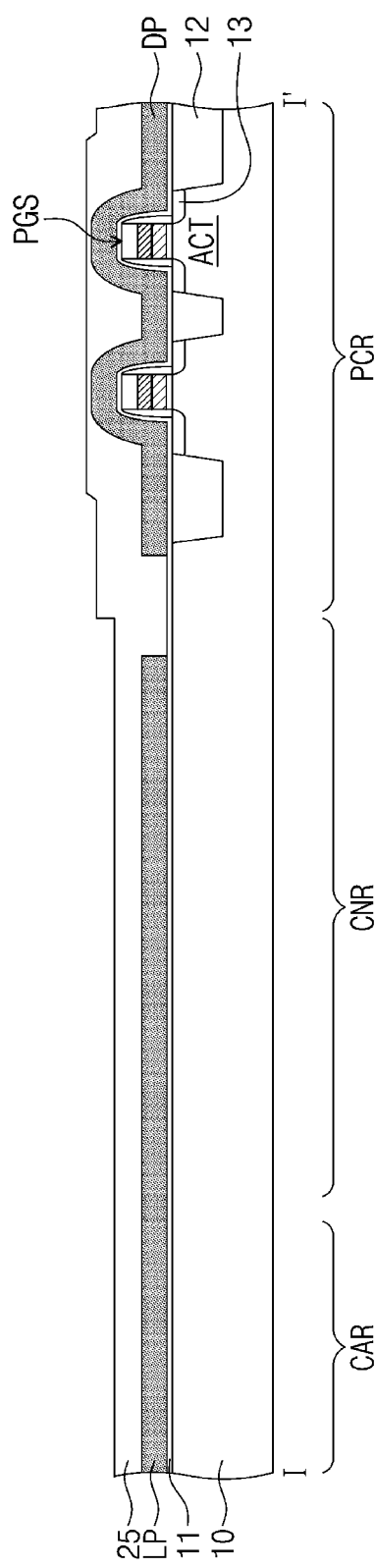
Figure 13C:
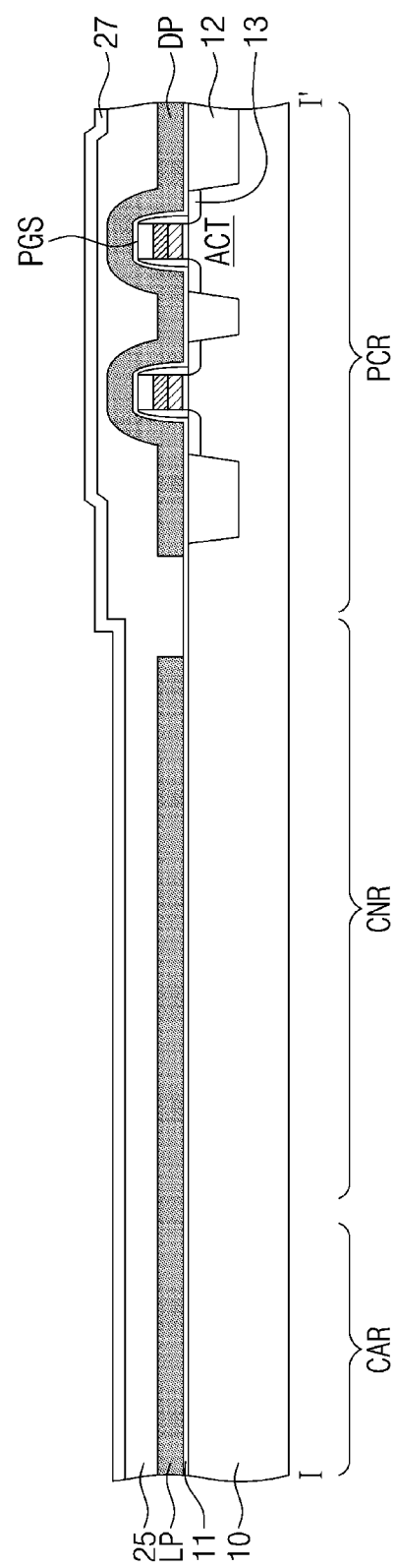

FIGS. 13A to 13C are cross-sectional views taken along line I-I' of FIG. 3, and illustrate a method of fabricating a three-dimensional semiconductor memory device according to exemplary embodiments of the inventive concept. For convenience of explanation, a further description of elements and processes previously described may be omitted.

Referring to FIG. 13A, as described with reference to FIG. 11C, a polishing process may be performed to remove the protruding portions of the lower insulating layer 20, and the mask pattern MP may then be formed on the lower insulating layer 20 to expose the cell array region CAR and the connection region CNR. For example, the lower insulating layer 20 may remain on the dummy sacrificial pattern DP, and the mask pattern MP may be formed on a portion of the lower insulating layer 20 remaining in the peripheral circuit region PCR. Thereafter, the first lower insulating layer 25 may be formed by anisotropically etching the lower insulating layer 20 using the mask pattern MP as an etch mask.

Referring to FIG. 13B, after the removal of the mask pattern MP, an etching process may be performed to etch the entire top surface of the first lower insulating layer 25. The APC method described above may be used to obtain a desirable thickness of the first lower insulating layer 25.

Referring to FIG. 13C, the second lower insulating layer 27 may be formed on the first lower insulating layer 25. In exemplary embodiments, the first lower insulating layer 25 may be interposed between the second lower insulating layer 27 and the lower sacrificial pattern LP and between the second lower insulating layer 27 and the dummy sacrificial pattern DP. Thereafter, the processes for forming the mold structure and the electrode structure may be performed, as described above.

FIGS. 14A to 14G are cross-sectional views taken along line I-I' of FIG. 3, and illustrate a method of fabricating a three-dimensional semiconductor memory device according to exemplary embodiments of the inventive concept. For convenience of explanation, a further description of elements and processes previously described may be omitted.

Figure 14A:
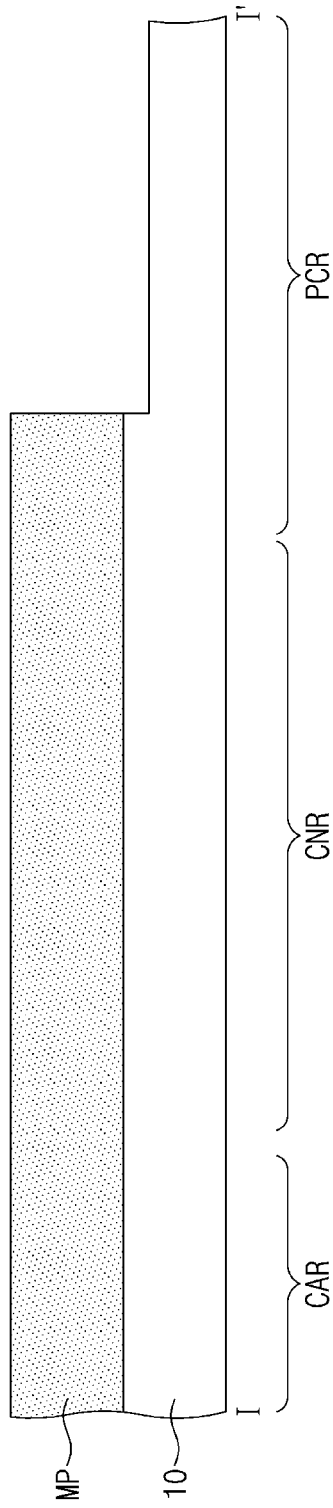

Referring to FIG. 14A, the mask pattern MP may be formed on the substrate 10, and may cover the cell array region CAR and the connection region CNR and expose the peripheral circuit region PCR. The substrate 10 may be etched using the mask pattern MP as an etch mask. The top surface of the substrate 10 may be recessed in the peripheral circuit region PCR.

Figure 14B:
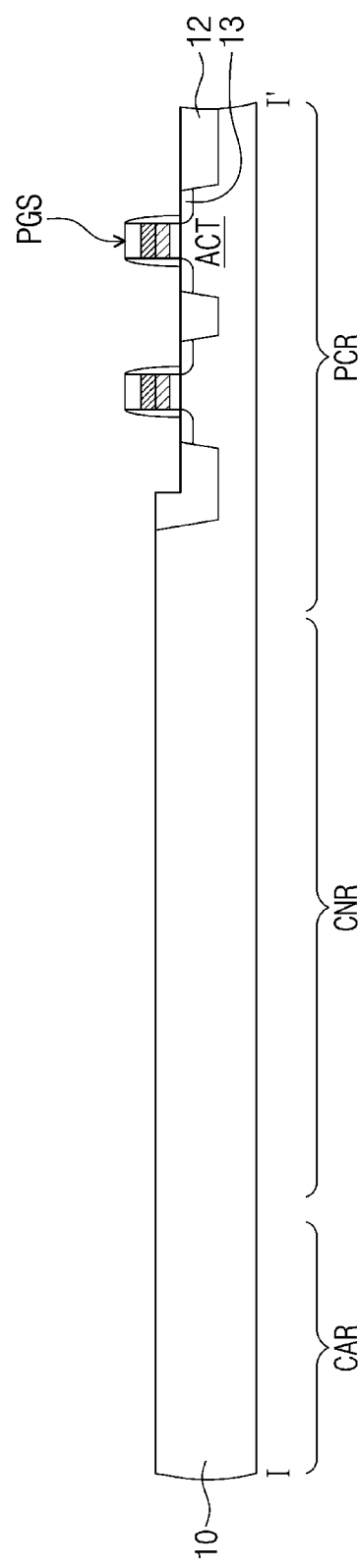

Referring to FIG. 14B, a peripheral circuit structure described with reference to FIG. 11A may be formed on the recessed top surface of the substrate 10. For example, the peripheral gate stacks PGS may be formed on the recessed top surface of the substrate 10. Top surfaces of the peripheral gate stacks PGS may be positioned at a level higher than the top surface of the cell array region CAR of the substrate 10. The level of the top surfaces of the gate stacks PGS may depend on a recess depth of the substrate 10 at the peripheral circuit region PCR.

Figure 14C:
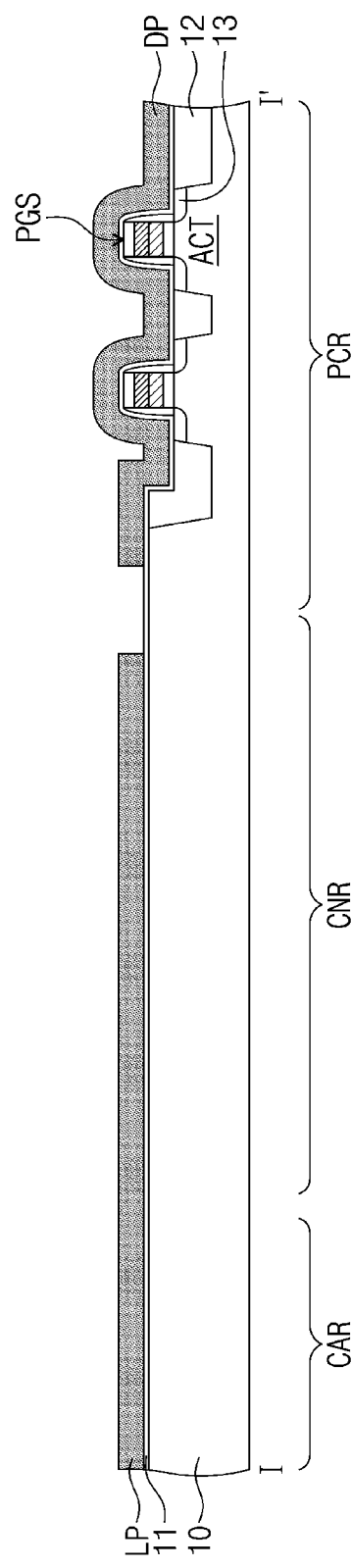

Referring to FIG. 14C, the lower sacrificial layer may be deposited on the substrate 10, and the lower sacrificial layer may then be patterned to form the lower sacrificial pattern LP and the dummy sacrificial pattern DP, as described with reference to FIG. 11B.

Figure 14D:
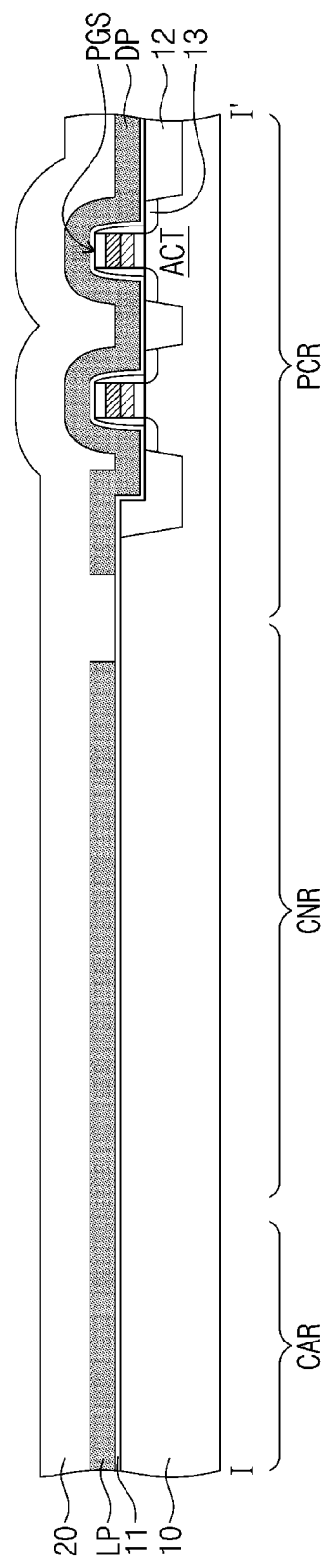

Referring to FIG. 14D, the lower insulating layer 20 may be formed to wholly cover the substrate 10 with the lower sacrificial pattern LP and the dummy sacrificial pattern DP. The lower insulating layer 20 may have a uniform thickness and may be deposited on the lower sacrificial pattern LP and the dummy sacrificial pattern DP.

Figure 14E:
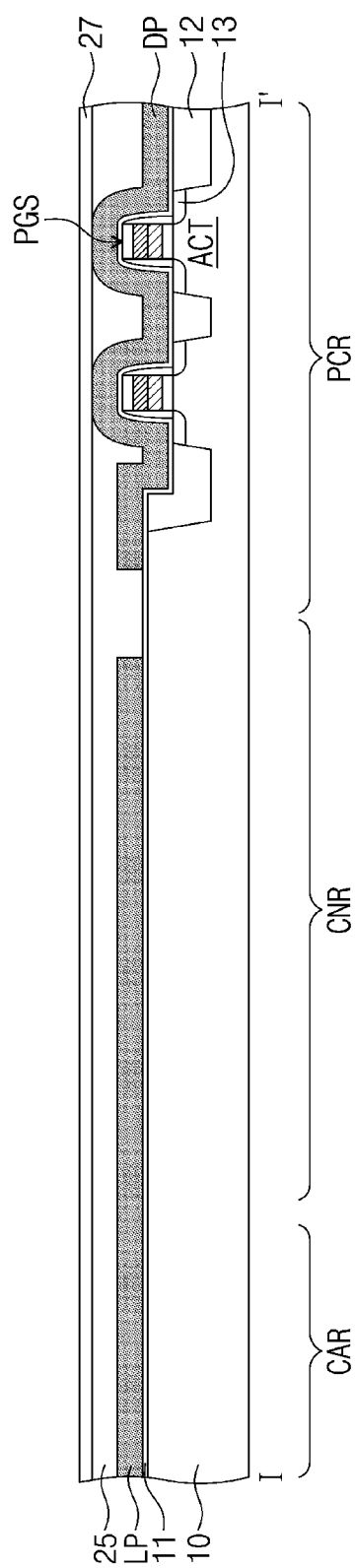

Referring to FIG. 14E, a planarization process may be performed on the lower insulating layer 20 to form the first lower insulating layer 25, as described with reference to FIGS. 11C to 11E. Thereafter, the second lower insulating layer 27 may be formed to conformally cover the first lower insulating layer 25 (e.g., with a constant thickness).

Figure 14F:
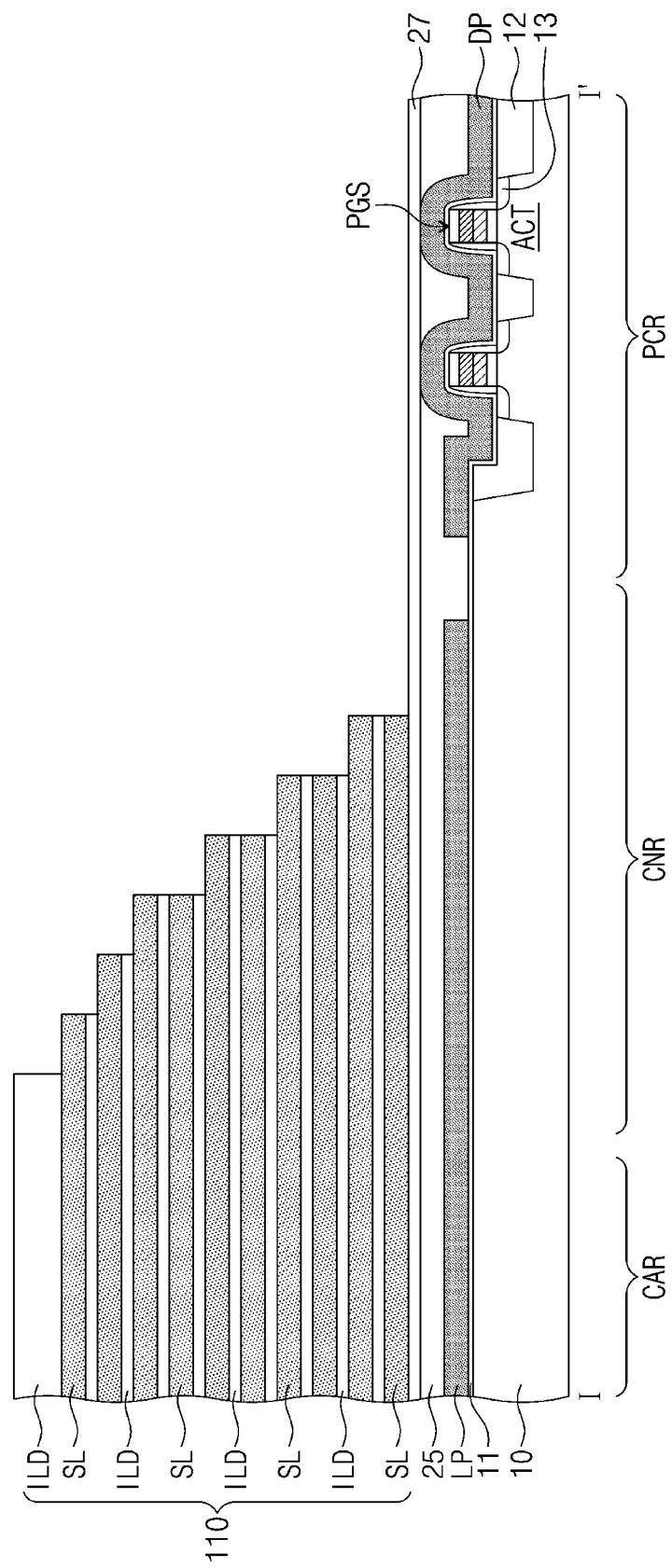

Referring to FIGS. 14F and 14G, the processes for forming the mold structure 110 and the electrode structure ST may be performed, as described above. The top surface of the substrate 10 in the peripheral circuit region PCR may be positioned at a level lower than in the cell array region CAR or the connection region CNR. Accordingly, bottom surfaces of the peripheral gate stacks PGS may be positioned below the bottom surface of the lower electrode ELa. In addition, top surfaces of the peripheral gate stacks PGS may be positioned between the top surface of the lower electrode ELa and the lowermost one of the upper electrodes ELb.

According to exemplary embodiments of the inventive concept, a lower insulating layer may be provided in a cell array region of a substrate and between vertically adjacent ones of electrodes, and moreover, may be extended to cover a peripheral circuit structure in a peripheral circuit region. Accordingly, a process of removing the lower insulating layer in the cell array region may be omitted, and upper electrodes and upper insulating layers may be alternately stacked on a planarized surface of the lower insulating layer covering the peripheral circuit structure. Thus, a process of fabricating a three-dimensional semiconductor memory device may be simplified, and fabrication costs may be reduced.

In addition, a thickness of the lower insulating layer in a region including the cell array region and the peripheral circuit region may be more precisely controlled, thereby improving reliability of a three-dimensional cell array.

In exemplary embodiments of the present inventive concept, a three-dimensional memory array is provided. The three-dimensional memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In exemplary embodiments of the present inventive concept, the three-dimensional memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

While the present inventive concept has been particularly shown and described with reference to exemplary embodiments thereof, it will be understood by one of ordinary skill in the art that variations in form and detail may be made therein without departing from the spirit and scope of the present inventive concept as defined by the following claims.

What is claimed is:

1. A three-dimensional semiconductor memory device, comprising:
   a substrate comprising a peripheral circuit region, a cell array region, and a connection region disposed between the peripheral circuit region and the cell array region;
   a plurality of peripheral gate stacks disposed in the peripheral circuit region of the substrate; and
   an electrode structure disposed in the cell array region of the substrate, wherein the electrode structure comprises a lower electrode, a lower insulating layer disposed on the lower electrode, and a plurality of upper electrodes and a plurality of upper insulating layers alternately stacked on the lower insulating layer,
   wherein the lower insulating layer extends from the cell array region into the peripheral circuit region and covers the peripheral gate stacks,
   wherein the lower insulating layer comprises a first lower insulating layer and a second lower insulating layer, and the first lower insulating layer is disposed between the second lower insulating layer and the substrate, wherein the second lower insulating layer has different thicknesses in the connection region,
wherein the first lower insulating layer comprises a first insulating material, and the second lower insulating layer comprises a second insulating material different from the first insulating material.

2. The three-dimensional semiconductor memory device of claim 1, wherein a thickness of the second lower insulating layer is less than a thickness of the first lower insulating layer.

3. The three-dimensional semiconductor memory device of claim 1, wherein the second lower insulating layer comprises:
a first portion disposed in the cell array region; and
a second portion disposed in the peripheral circuit region,
wherein a thickness of the second portion is less than a thickness of the first portion.

4. The three-dimensional semiconductor memory device of claim 1, wherein a sidewall of the second lower insulating layer is substantially aligned with a sidewall of a lowermost one of the upper electrodes.

5. The three-dimensional semiconductor memory device of claim 1, wherein the upper insulating layers comprise the second insulating material.

6. The three-dimensional semiconductor memory device of claim 1, wherein a thickness of the first lower insulating layer is thinner in the cell array region than in the peripheral circuit region.

7. The three-dimensional semiconductor memory device of claim 1, wherein bottom surfaces of the peripheral gate stacks are positioned below a bottom surface of the lower electrode.

8. The three-dimensional semiconductor memory device of claim 1, wherein top surfaces of the peripheral gate stacks are positioned between a top surface of the lower electrode and a bottom surface of a lowermost one of the upper electrodes.

9. The three-dimensional semiconductor memory device of claim 1, wherein the first lower insulating layer comprises a portion disposed between adjacent ones of the peripheral gate stacks.

10. The three-dimensional semiconductor memory device of claim 1, wherein the first lower insulating layer defines an air gap disposed between adjacent ones of the peripheral gate stacks.

11. The three-dimensional semiconductor memory device of claim 1, further comprising:
a plurality of vertical structures, wherein the vertical structures penetrate the electrode structure in the cell array region and are connected to the substrate.

12. A three-dimensional semiconductor memory device, comprising:
a substrate comprising a peripheral circuit region and a cell array region;
a plurality of peripheral gate stacks disposed in the peripheral circuit region of the substrate; and
an electrode structure disposed in the cell array region of the substrate, wherein the electrode structure comprises a lower electrode, a lower insulating layer disposed on the lower electrode, and a plurality of upper electrodes and a plurality of upper insulating layers alternately stacked on the lower insulating layer,
wherein the lower insulating layer extends from the cell array region into the peripheral circuit region and covers the peripheral gate stacks,
wherein a top surface of the lower insulating layer is lower in the cell array region than in the peripheral circuit region,
wherein the lower insulating layer comprises a first lower insulating layer and a second lower insulating layer, and the first and second lower insulating layers are sequentially stacked,
wherein a top surface of the first lower insulating layer is lower in the cell array region than in the peripheral circuit region, and
wherein a top surface of the second lower insulating layer is lower in the cell array region than in the peripheral circuit region.

13. The three-dimensional semiconductor memory device of claim 12,
wherein the first lower insulating layer comprises a first insulating material, and the second lower insulating layer comprises a second insulating material different from the first insulating material.

14. The three-dimensional semiconductor memory device of claim 13, wherein a first thickness of the first lower insulating layer in the cell array region is less than a second thickness of the first lower insulating layer in the peripheral circuit region.

15. The three-dimensional semiconductor memory device of claim 13, wherein the upper insulating layers comprise the second insulating material.

16. The three-dimensional semiconductor memory device of claim 13, further comprising:
a dummy sacrificial pattern disposed in the peripheral circuit region and conformally covering the peripheral gate stacks,
wherein the dummy sacrificial pattern comprises a third insulating material different from the first and second insulating materials.

17. The three-dimensional semiconductor memory device of claim 16, wherein the first lower insulating layer comprises a portion disposed between the peripheral gate stacks and on the dummy sacrificial pattern, and
the second lower insulating layer extends from ft the top surface of the first lower insulating layer to a top surface of a portion of the dummy sacrificial pattern.

18. A three-dimensional semiconductor memory device, comprising:
a substrate comprising a peripheral circuit region and a cell array region;
a plurality of peripheral gate stacks disposed in the peripheral circuit region of the substrate;
an electrode structure disposed in the cell array region of the substrate, wherein the electrode structure comprises a lower electrode, a lower insulating layer disposed on the lower electrode, and a plurality of upper electrodes and a plurality of upper insulating layers alternately stacked on the lower insulating layer; and
a dummy sacrificial pattern disposed in the peripheral circuit region and conformally covering the peripheral gate stacks,
wherein the lower insulating layer extends from the cell array region into the peripheral circuit region and covers the peripheral gate stacks,
wherein the lower insulating layer comprises a first lower insulating layer and a second lower insulating layer, and the first and second lower insulating layers are sequentially stacked,
wherein the first lower insulating layer comprises a portion disposed between the peripheral gate stacks and on the dummy sacrificial pattern, wherein the second lower insulating layer extends from a top surface of the first lower insulating layer to a top surface of a portion of the dummy sacrificial pattern, and wherein the first lower insulating layer is located at a level that is substantially equal to or lower than a topmost surface of the dummy sacrificial pattern.

19. The three-dimensional semiconductor memory device of claim 18, wherein the first lower insulating layer comprises a first insulating material, and the second lower insulating layer comprises a second insulating material different from the first insulating material, wherein the dummy sacrificial pattern comprises a third insulating material different from the first and second insulating materials.

* * * * *